United States Patent
Lyons et al.

(10) Patent No.: US 10,429,748 B2
(45) Date of Patent: Oct. 1, 2019

(54) APPARATUS INCLUDING A GAS GAUGE AND METHOD OF OPERATING THE SAME

(71) Applicants: ASML HOLDING N.V., Veldhoven (NL); ASML NETHERLANDS B.V., Veldhoven (NL)

(72) Inventors: Joseph Harry Lyons, Wilton, CT (US); Martinus Cornelis Reijnen, Tilburg (NL); Erik Johan Arlemark, Waalre (NL); Nicolae Marian Ungureanu, Shelton, CT (US); James Hamilton Walsh, Newtown, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/576,444

(22) PCT Filed: Jun. 6, 2016

(86) PCT No.: PCT/EP2016/062778
§ 371 (c)(1),
(2) Date: Nov. 22, 2017

(87) PCT Pub. No.: WO2016/202621
PCT Pub. Date: Dec. 22, 2016

(65) Prior Publication Data
US 2018/0157181 A1 Jun. 7, 2018

Related U.S. Application Data

(60) Provisional application No. 62/181,465, filed on Jun. 18, 2015, provisional application No. 62/202,651, filed on Aug. 7, 2015.

(51) Int. Cl.
*G03F 7/20* (2006.01)
*G01B 13/12* (2006.01)
*G03F 9/00* (2006.01)

(52) U.S. Cl.
CPC ......... *G03F 7/70775* (2013.01); *G01B 13/12* (2013.01); *G03F 9/7057* (2013.01)

(58) Field of Classification Search
CPC ...... G03F 7/707; G03F 7/7085; G03F 7/2041; G03F 7/70733; G03F 7/70925;
(Continued)

(56) References Cited

U.S. PATENT DOCUMENTS

| | | |
|---|---|---|
| 4,953,388 A | 9/1990 | Barada |
| 6,978,658 B1 | 12/2005 | Kochersperger |

(Continued)

FOREIGN PATENT DOCUMENTS

| | | |
|---|---|---|
| CN | 1510394 | 7/2004 |
| CN | 100427881 | 10/2008 |

(Continued)

OTHER PUBLICATIONS

Machine translation for JP-2007003508-A, the prior art to Kochersperger.*

(Continued)

*Primary Examiner* — Mesfin T Asfaw
(74) *Attorney, Agent, or Firm* — Pillsbury Winthrop Shaw Pittman LLP

(57) ABSTRACT

An apparatus, such as a lithographic apparatus, has a metrology frame that has a reference frame mounted thereon that includes a reference surface. A gas gauge is movable relative to the reference frame, metrology frame, and a measured surface. A reference nozzle in the gas gauge provides gas to the reference surface and a measurement nozzle provides gas to the measured surface. A microelectromechanical (Continued)

(MEM) sensor may be used with the gas gauge to sense a difference in backpressure from each of the reference nozzle and the measurement nozzle. Optionally, multiple gas gauges are positioned in an array, which may extend in a direction that is substantially parallel to a plane of the measured surface. The gauges may be fluidly connected to a reference nozzle of the gas gauge. A channel may distribute gas across the array.

20 Claims, 13 Drawing Sheets

(58) Field of Classification Search
CPC ............... G03F 7/7095; G03F 7/70808; G03F 7/70858; G03F 7/708; G01L 13/025; G01L 21/00; G01L 27/005; G01L 9/0041; G01L 9/0075; G01L 19/02; G01L 7/082; G01L 9/0044; G01L 19/0645
See application file for complete search history.

(56) References Cited

U.S. PATENT DOCUMENTS

| | | | |
|---|---|---|---|
| 7,124,624 | B2 | 10/2006 | Gajdeczko et al. |
| 7,437,911 | B2 | 10/2008 | Galburt et al. |
| 7,797,985 | B2 | 9/2010 | Galburt et al. |
| 8,220,315 | B2 | 7/2012 | Labetski et al. |
| 9,358,696 | B2 | 6/2016 | Lyons |
| 2005/0268698 | A1 | 12/2005 | Gajdeczko et al. |
| 2006/0123888 | A1 | 6/2006 | Galburt et al. |
| 2010/0116029 | A1 | 5/2010 | Labetski et al. |
| 2010/0139373 | A1* | 6/2010 | Braman ............... B81B 7/0041 73/40.7 |
| 2011/0069291 | A1 | 3/2011 | Sogard |
| 2011/0125424 | A1* | 5/2011 | Han .................. G01F 1/32 702/47 |
| 2012/0120380 | A1 | 5/2012 | Lyons |
| 2012/0242969 | A1 | 9/2012 | Van Der Pasch et al. |
| 2014/0320832 | A1 | 10/2014 | Sogard et al. |

FOREIGN PATENT DOCUMENTS

| | | |
|---|---|---|
| CN | 102165373 | 8/2011 |
| DE | 2807881 | 10/1978 |
| EP | 1431709 | 6/2004 |
| JP | 2000258679 | 9/2000 |
| JP | 2004198429 | 7/2004 |
| JP | 2006189429 | 7/2006 |
| JP | 2007003508 | 1/2007 |
| JP | 2010114445 | 5/2010 |
| JP | 2012191205 | 10/2012 |
| JP | 2012531031 | 12/2012 |

OTHER PUBLICATIONS

Machine translation of JP-2007003508-A, the prior art to Kochersperger.*
International Search Report and Written Opinion dated Aug. 24, 2016 in corresponding International Patent Application No. PCT/EP2016/062778.
Japanese Office Action issued in corresponding Japanese Patent Application No. 2017-565723, dated Feb. 5, 2019.
Chinese Office Action issued in corresponding Chinese Patent Appiication No. 2016800352027, dated Jun. 18, 2019.

* cited by examiner

APPARATUS INCLUDING A GAS GAUGE AND METHOD OF OPERATING THE SAME

CROSS-REFERENCE TO RELATED APPLICATIONS

This application is the U.S. national phase entry of PCT patent application no. PCT/EP2016/062778, which was filed on Jun. 6, 2016, which claims the benefit of priority of U.S. application No. 62/181,465, which was filed on Jun. 18, 2015, and U.S. application No. 62/202,651, which was filed on Aug. 7, 2015, and which is incorporated herein in its entirety by reference.

FIELD

The present disclosure relates to an apparatus and measurement system including a gas gauge, and a method for operating the same.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern may be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction.

In order to, for example, improve accuracy during exposure and/or to prevent collisions during movement of parts, one or more systems are provided to sense and/or measure relative to a reference point, such as sensor or measure the substrate.

SUMMARY

Some systems to detect a substrate employ an optical or capacitive sensor (or probe) and method. Although these may have good range accommodation, they may suffer from error due to interactions with material on the surface to be measured (circuitry, resist, hard masks, optics, etc.). Some other types of sensors have limited detection range but are superior in other domains, such as process sensitivity. Examples of such sensors are gas gauges, atomic force microscopes, and scanning tunneling microscopes. The limited detection range of these types of sensors may limit applications where full time proximity to a surface being measured may be a risk and impediment to usage.

A gas gauge may offer significant accuracy over optical and capacitance sensors, for example, when measuring a topographic map of a coated substrate, since the gas gauge does not suffer from interactions with underlying films as may occur with optical and capacitance sensors. A gas gauge measures just a top surface of a substrate, which is an ideal reference for a coated surface.

A gas gauge can be used to measure the location of a substrate (or other) target surface in a lithography tool. The gas gauge typically includes a pneumatic bridge having a measurement nozzle located near the target surface. The gas gauge typically also includes a separate reference nozzle located near, or in the same environment as, the measurement components. As a gap between the target surface and the measurement nozzle changes, the flow rate through the measurement nozzle is altered, and a change in differential pressure or flow in the bridge is detected. Any change in the gap of the measuring nozzle to the target surface results in a pressure imbalance in the bridge. This pressure imbalance may be detected by means of a pressure sensor, or a flow device if the flow is insignificant to the flow in the nozzles. The gap measurements made by a gas gauge tend to be most accurate when the target surface is at a nominal gap where the flow through the bridge is nearly balanced, and becomes less accurate as the measurement gap moves away from the nominal value. Off null, the relationship between gap and sensed differential flow or pressure is compromised, which can result in diminished readings and increased common mode errors.

The gas gauge in a lithography application is typically used at a fixed standoff distance ("standoff") of less than approximately 0.300 millimeters (mm). At such a small standoff, there is a possibility of a collision between the gas gauge nozzle and, for example, the target surface.

Also, to the extent that the gas gauge is used to accurately measure a range of target surface positions, its accuracy may be limited. Accordingly, a method and system for facilitating measurements using a gas gauge to maximize its performance and useful measurement range would be beneficial.

A gas gauge may have one or more issues associated therewith. The dynamic response of a pneumatic system is inversely proportional to the internal volume of the plumbing (capacity) and the pneumatic resistances involved. To achieve as much sensitivity as possible, the design of the pressure sensing device drives towards larger diaphragms for the pressure sensing device to achieve obtain the desired deflection or strain. This drive towards a larger pressure sensing device increases internal volume, and is counter to the desire for faster pneumatic response time that a smaller volume brings. Additionally or alternatively, the gas gauge measures a change in gap, and the stability of that measurement relies on a stable mounting platform. If that platform is a mechanism that allows for extend and retract repositioning of the gas gauge nozzle assembly, then the extension/retraction stability is a source of error. A means to solve this problem is to use a separate metrology system to track the position of the extend/retract mechanism with respect to the frame of reference. However accurate, such a metrology system can be a source of error, due to its sensing system noise, linearity and/or drift. Additionally or alternatively, as discussed in more detail with reference to FIG. 4, the gas gauge reference gap may be mounted to the gas gauge body and moves with the gas gauge. Accordingly, gas gauge readings should be compensated for error motions as detected by the extension/retraction metrology. This involves additional measurements or calculations to determine if the error(s) is due to gap shrinkage or, for example, a servo motor error.

According to an aspect of this disclosure, there is provided an apparatus including a metrology frame constructed and arranged as a substantially stationary frame of reference and a reference frame mounted to the metrology frame that has a reference surface. Also included is a measurement platform that has a gas gauge. The measurement platform is movable relative to the reference frame, metrology frame, and a measured surface. The gas gauge has a reference nozzle configured to provide gas to the reference surface and a measurement nozzle configured to provide a gas to the measured surface.

According to another aspect of this disclosure there is provided a method for measuring a surface in an apparatus, the apparatus having a metrology frame constructed and arranged as a substantially stationary frame of reference, a reference frame mounted to the metrology frame having a reference surface, and a measurement platform comprising a gas gauge. The measurement platform is movable relative to the reference frame, metrology frame, and a measured surface. The gas gauge has a reference nozzle configured to provide gas to the reference surface and a measurement nozzle configured to provide gas to the measured surface and a sensor. The method includes: providing gas to the reference nozzle of the gas gauge; providing a substantially constant flow of gas to the measurement nozzle of the gas gauge; and sensing with the sensor a difference in backpressure from each of the reference nozzle and the measurement nozzle. The reference nozzle is configured to provide gas to the reference surface and the measurement nozzle is configured to provide a gas to the measured surface.

Yet another aspect of this disclosure provides a gas gauge that includes a reference nozzle configured to provide a gas to a reference surface; a measurement nozzle configured to provide the gas to a measured surface; and a MEMs sensor that is constructed and arranged to sense a difference in backpressure from each of the reference nozzle and the measurement nozzle.

Features and/or advantages of embodiments of the disclosure, as well as the structure and operation of various embodiments of the disclosure, are described in detail herein with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the disclosure will now be described, by way of example only, with reference to the accompanying drawings in which.

Figure 1:
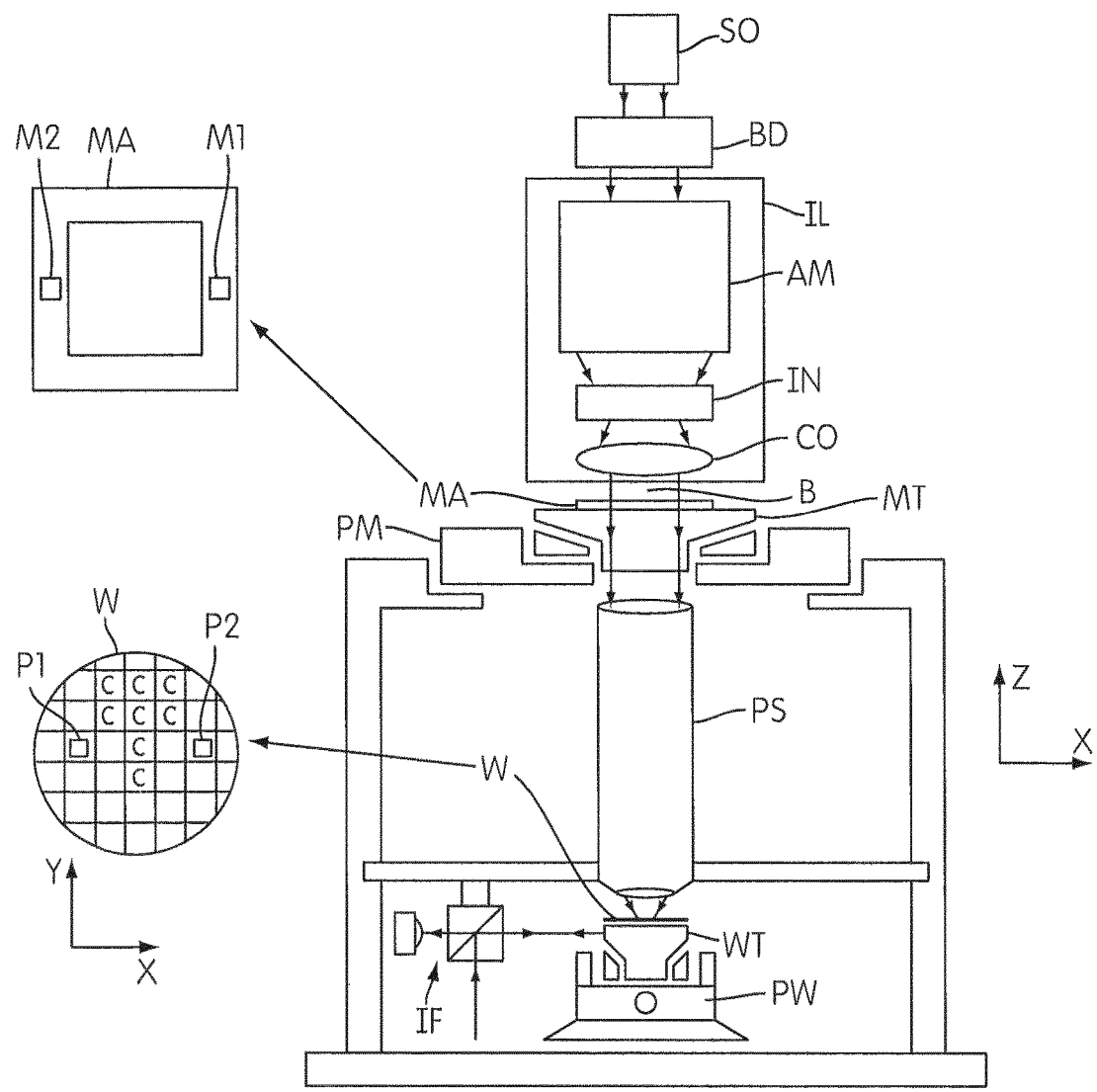
FIG. 1 schematically depicts a lithographic apparatus according to an embodiment of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements, even if such reference numbers or elements are not substantially described with reference to each noted Figure.

DETAILED DESCRIPTION OF EXEMPLARY EMBODIMENTS

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that one can effect such feature, structure, or characteristic in connection with one or more other embodiments whether or not explicitly described.

It would be apparent to one skilled in the art that embodiments, as described herein, may be implemented in many different forms of hardware, software, firmware, and/or the entities illustrated in the drawings. Any actual software code with the specialized controlled hardware to implement an embodiment is not limiting. Thus, the operation and behavior of embodiments will be described with the understanding that modifications and variations of the embodiments are possible, given the level of detail presented herein.

Before describing embodiments in detail, it is instructive to present an example environment in which embodiments may be implemented.

FIG. 1 schematically depicts a lithographic apparatus LA. The apparatus includes an illumination system (illuminator) IL configured to condition a radiation beam B (e.g., UV radiation or DUV radiation or EUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support may use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT may be moved accurately, e.g., so as to position different target portions C in the path of the radiation beam B. Similarly, the first positioner PM and another position sensor (which is not explicitly depicted in FIG. 1) may be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which may detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C may be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed. For example, the apparatus may be a dual stage apparatus.

Figure 2:
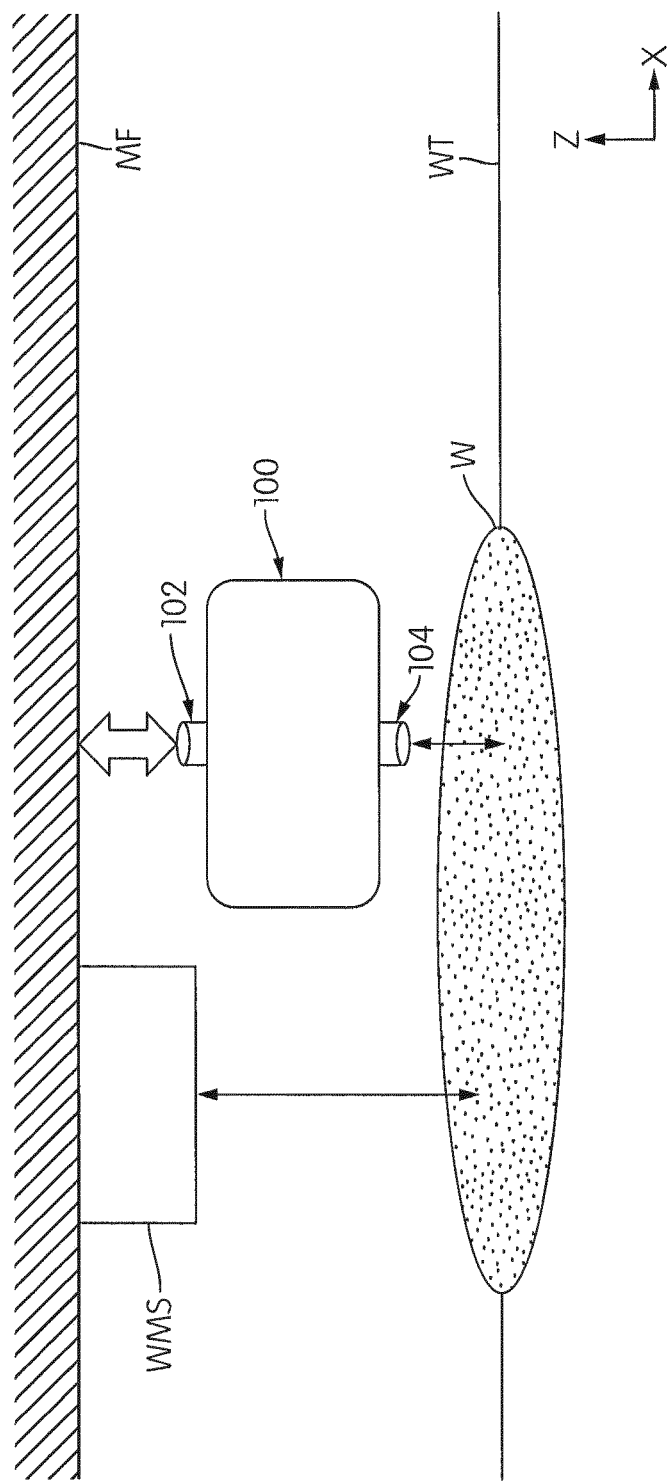
FIG. 2 is a schematic view of an embodiment showing a digital measurement platform in an apparatus.

FIG. 2 illustrates a digitally stabilized measurement platform 100 that is used in an apparatus, in accordance with an embodiment. In one embodiment, the apparatus is a lithographic apparatus such as the exemplary apparatus shown in FIG. 1. The apparatus has a metrology frame MF that is used as a substantially stationary frame of reference (or reference point) for both a metrology system WMS as well as for the measurement platform 100. In an embodiment, the metrology system WMS is a substrate metrology system. The metrology system WMS may determine a relative proximity (e.g., distance) between the metrology frame MF and a measured target surface of an object, such as a substrate W (on substrate stage WT).

The measurement platform 100 utilizes a digital measurement system 102 (or sensor, or sensing system) and a proximity measurement system 104 (or sensor, or sensing system). The digital measurement system 102 is used to measure or estimate a proximity or distance between the measurement platform 100 and the metrology frame MF. The digital measurement system 102 may continuously keep track of the measurement platform 100 with respect to the metrology frame MF. The digital measurement system 102 may include, and/or communicate with (e.g., via a controller), one or more actuators or mechanisms configured to move (e.g., extend and/or retract) the measurement platform 100 relative to the metrology frame MF. In an embodiment, the digital measurement system 102 comprises two or more sensors configured to measure relative movement between the measurement platform 100 and the metrology frame MF. The sensors of the digital measurement system 102 may be provided on the measurement platform 100, on the metrology frame MF, on both, or on neither (instead mounted on an adjacent part, for example).

Use of a digital measurement system 102 enables movement of its sensor 104 (e.g., relatively short range sensor) in close proximity to the desired target to be measured (i.e., the substrate W in FIG. 2). Further, a digital measurement system is less sensitive to interference and has better reproducibility. Thus, the measurement(s) determined by the digital measurement system 102 may be highly accurate. Further, the platform 100 should be held at high accuracy, or its position determined with high accuracy, by using an additional sensor (or system) (e.g., relatively long range sensor) of the digital measurement system 102, where the additional sensor is highly accurate and includes an adequate range to cover the application requirements. Together, the sensors 104 and 102 would effectively act as one sensor with long range and superior performance.

The sensor(s) in the digital measurement system 102 may be any type of digital sensor. In an embodiment, the digital measurement system 102 of the measurement platform 100 includes a sensor that may take the form of a digital encoder, and/or a digital heterodyne interferometer, and/or other digital based sensing system.

The proximity measurement system 104 of the measurement platform 100 utilizes a target surface, such as a surface of a substrate W on a substrate stage WT, for measurement within an apparatus. In an embodiment, a relative proximity between the measurement platform 100 and the target surface is determined. The proximity measurement system 104 may keep track of the target surface with respect to the metrology frame MF. Each of the systems 102 and 104 may utilize sensors (e.g., communicatively connected to a controller) for sensing or measuring their reference targets or surfaces, for example.

In an embodiment, the measurement platform 100 comprises a gas gauge and a pressure or flow sensor 138 as part of its proximity measurement system 104. The measurement platform 100 may be configured to sense or measure a surface of the substrate W (and its relative position(s)).

Figure 3:
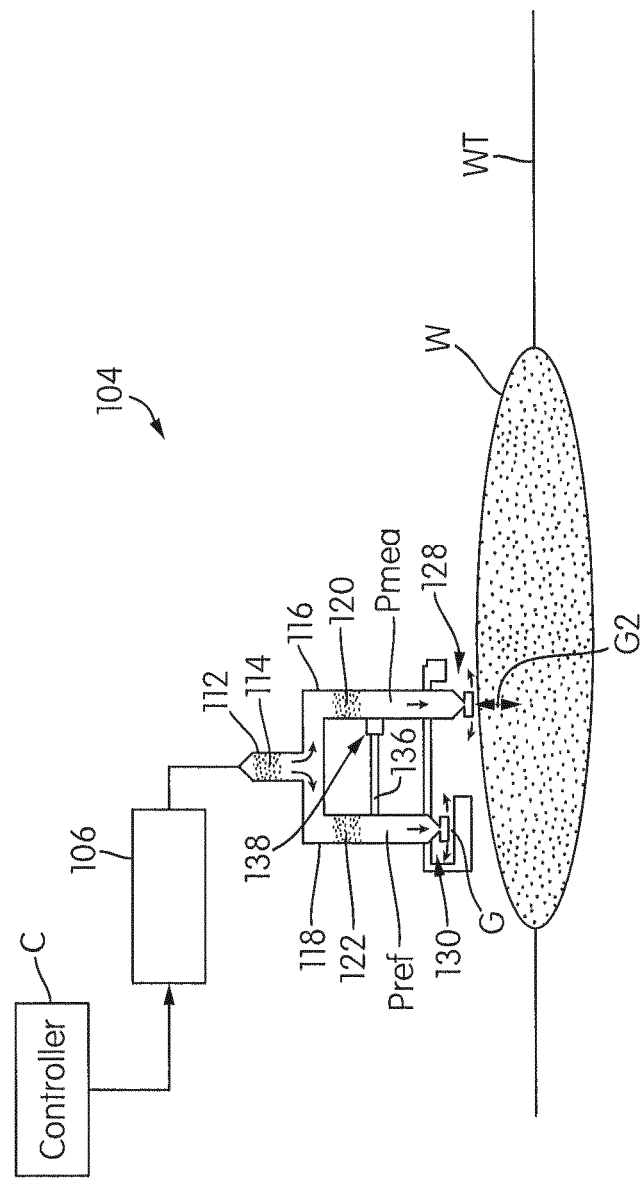
FIG. 3 shows a schematic view of a gas gauge used in the measurement platform of FIG. 2, according to an embodiment of the disclosure.

FIG. 3 illustrates an example of a gas gauge provided with a pressure sensor 138. As shown, a controller C may be coupled with a gas supply 106 (e.g., air supply) which is configured to supply or inject gas (e.g., air from an air source (not shown), or other gas from a gas source (not shown)) to a nozzle or head of the gas gauge at a desired pressure via a central channel 112. The controller C may be configured to maintain a constant flow rate of gas, or a constant pressure to achieve the same, within the gas gauge. Further, as explained below, the controller C is configured to communicate with the gas gauge and adjust a position of the measurement platform 100, if needed. The controller C may also be configured adjust a position of a measured surface, a substrate table, or both. In an embodiment, the controller is a servo controller that is configured to control movement of the measured surface (e.g., of the substrate W via moving substrate table WT) in a predetermined direction (e.g., Z direction).

The type of gas supplied or distributed via gas supply 106 and the gas gauge(s) disclosed herein may vary. As previously noted, in one embodiment, air may be supplied by the gas supply 106. However, it should be understood that throughout this disclosure any reference to air or gas is not intended to be limiting. That is, "gas" may refer to a single elemental gas (e.g., nitrogen, hydrogen, etc.), or a compound (e.g., such as carbon dioxide), or a mixture of gases (such as air).

In accordance with embodiments herein, hydrogen ($H_2$) gas is provided in gas supply 106 and distributed to the gas gauge(s) in accordance with embodiments of this disclosure. In an embodiment, the gas provided by gas supply 106 consists essentially of hydrogen ($H_2$) gas. In an embodiment, the gas provided by gas supply 106 comprises more than or equal to 10%, more than or equal to 20%, more than or equal to 30%, more than or equal to 40%, more than or equal to 50%, more than or equal to 60%, more than or equal to 70%, more than or equal to 80%, more than or equal to 90%, more than or equal to 95%, or more than or equal to 99% of hydrogen ($H_2$) gas. The use of hydrogen ($H_2$) gas with gas gauges and measurements are described further hereafter.

As schematically shown in FIG. 3, the gas gauge also includes a measurement channel 116, a reference channel 118, a measurement channel restrictive element 120, a reference channel restrictive element 122, a measurement device 128, a reference device 130, a bridge channel 136, and a pressure or flow sensor 138. The central channel 112 connects the gas supply 106 to the measurement channel 116 and reference channel 118. For example, the central channel 112 divides into the measurement channel 116 and the reference channel 118. A substantially constant flow of gas may be provided to the measurement device 128.

The measurement channel 116 and the reference channel 118 may contain restrictive elements 120 and 122. Each of the restrictive elements 120 and 122 restricts the flow of gas traveling through their respective measurement channel 116 and the reference channel 118. Any number of devices may be used as a restrictive element, including, but not limited to, narrow tubes or channels, limited orifices (e.g., limited in width (e.g., diameter) at a point along a length of the channel), or a valve-like device placed within a channel. As such, the mechanism or device to restrict is not intended to be limiting.

Likewise, a central channel restrictive element 114 may be located within the central channel 112 before it splits into the measurement channel 116 and reference channel 118. Again, as noted above, the mechanism to restrict the central channel 112 is not limiting. Additionally and/or alternatively, the center channel restrictive element 114 acts as a filter for gas received from the gas supply 106.

The bridge channel 136 is coupled between the measurement channel 116 and the reference channel 118. The bridge channel 136 receives a backpressure when gas is imbalanced in the gas gauge, which is explained in further detail below. The bridge channel 136 includes the sensor 138. In an embodiment, the pressure sensor is a dynamic response device in the form of a MEMs sensor. The MEMs sensor senses a difference or imbalance in backpressure from each of the reference nozzle and the measurement nozzle, as gas backflows in either direction through the bridge channel 136 from the measurement channel 116 and reference channel 118, to detect a bridge imbalance, and hence a gap imbalance, relative to the measured surface. Accordingly, in one embodiment, sensor 138 may be defined as a differential pressure sensor. The reference channel 118 may have a backpressure Pref and the measurement channel 116 may have a backpressure Pmea.

A MEMs device by nature is small, and so employing a MEMs device to sense pressure in a gas gauge will allow for smaller internal volumes (smaller differential detection) and/or faster response times (resulting in a frequency and/or speed advantage). For example, a MEMs sensor might have an internal volume approaching 1 mm^3. Since equivalent sensitivity for a capacitance sensor is typically around 60 mm^3, using a MEMs sensor may result in roughly a 10× reduction in pneumatic bandwidth, with a much smaller package. In an embodiment, the MEMs device may comprise a differential pressure sensor, a miniature very low flow gauge, or a Coriolis Effect flow gauge, or comprise two or more absolute MEMs pressure sensors with the difference being determined by electrical or computational methods. In another embodiment, the MEMs device may be a flow sensor. Such a MEMs flow sensor may be used in a system exposed to the atmosphere, for example.

In an embodiment, because of the bridge configuration, gas backflow may occur through the bridge channel 136 only when pressure differences between the channels 116 and 118 occur (difference between Pref and Pmea). In an embodiment, the MEMs sensor may be a differential pressure sensor is designed to detect a change in pressure (as a difference between two applied pressures). The differential pressure sensor may measure or sense the difference in pressure between the two channels, which may be a function of the difference between measurement and reference gaps G2 and G (respectively) relative to reference surfaces.

Although shown schematically in the form of an upside-down "U" shape, it should be understood to one of ordinary skill in the art that there is no inherent requirement that the gas gauge parts and channels be symmetrical. Similarly, the positioning of the sensor 138, as shown in FIG. 3, need not be, but may be, central to the bridge channel 136.

All channels within the gas gauge 100 may permit a flow gas through them. The channels 112, 116, 118, and 136 may be made up of conduits (e.g., tubes, pipes, etc.) or any other type of structure that may contain and guide gas flow through the system 104. In most embodiments, the channels 112, 116, 118, and 136 may be configured such that little pneumatic noise is produced (such noise may result from the production of local turbulence or flow instability, as an example). In embodiments, overall lengths of the measurement channel 116 and the reference channel 118 may be equal or unequal.

The reference channel 118 terminates at a reference device 130 configured to deliver gas, which may take the form of a nozzle (hereafter referred to as a "reference nozzle").

Likewise, the measurement channel 116 terminates at a measurement device 128 configured to deliver gas, which may take the form of a nozzle (hereafter referred to as a "measurement nozzle"). These nozzles 128, 130 are provided to distribute gas towards their associated surfaces. For example, as described below, gas injected by the gas supply 106 is emitted from the nozzles 128 and 130 (e.g., in a substantially constant flow), and impinges upon a measured surface of, e.g., a substrate W and a reference surface 134 of a reference frame 132, respectively. Varying the distance between the substrate W and measurement nozzle 128, for example, varies the pressure of the gas within the nozzle, which in turn is used as a measure for the distance between the nozzle 128 and the substrate W. Sensor 138 is configured to detect (or sense) a difference in pressure Pref and Pmea (as a result of being impinged upon the respective surfaces). Based on the detection of a sensed difference in pressures, the measured surface (e.g., surface of the substrate W) may have its position adjusted. As explained further below, such movement (e.g., of the measurement platform or substrate table) allows and enables maintenance of a substantially constant gap.

Figure 4:
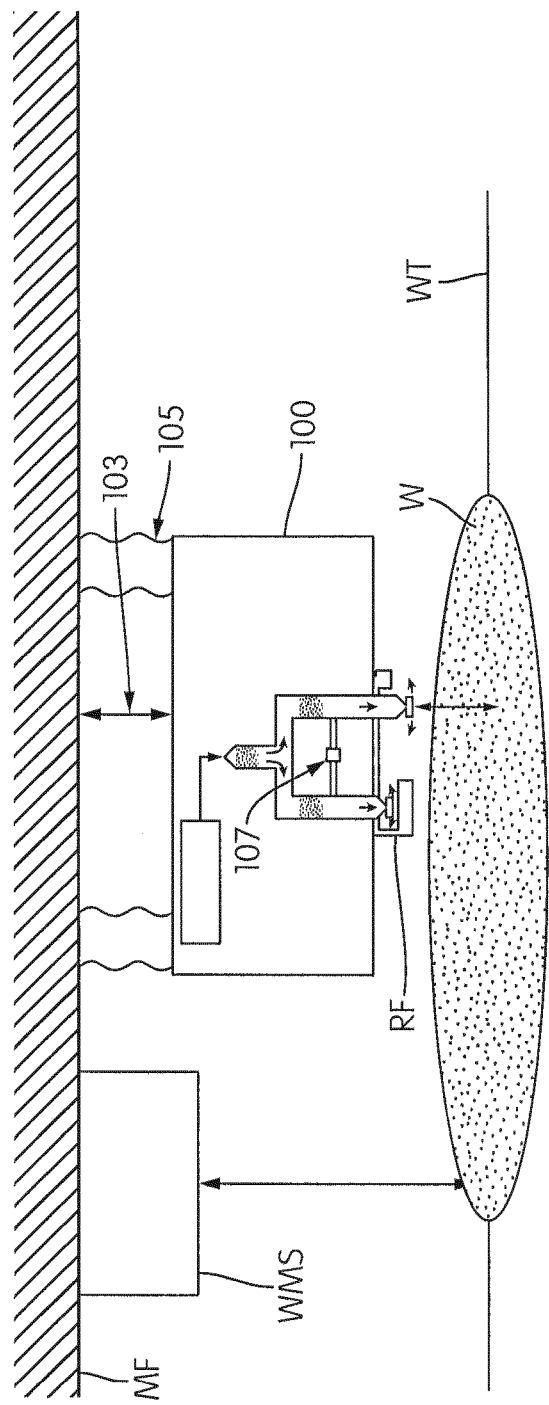
FIG. 4 shows an example of a system utilizing a gas gauge with an associated reference point.

As described previously, the distance between a nozzle and a corresponding reference surface may be referred to as a reference gap. In known systems, the reference gap is provided at a fixed standoff. For example, FIG. 4 illustrates an example of a system that includes a reference frame RF that is provided within and/or mounted directly to a measurement platform 100 comprising a gas gauge and its associated pressure sensor 107. That is, the reference frame RF is mounted to the gas gauge body (100) such that the standoff (or reference gap) is fixed and moves with the gas gauge. However, as discussed previously, errors (e.g., due to sensing system noise, linearity and/or drift) may still occur when measuring a target surface in this manner. The analog extend-retract metrology system 103 may incorrectly move the gas gauge via extend retract mechanism 105 causing an error.

Instead of a fixed standoff, an embodiment of this disclosure is designed to utilize a reference surface wherein the gas gauge is moved relative to the reference surface. In embodiments, such as those described with reference to FIGS. 5-10, the reference nozzle 130 is positioned above a reference surface 134 of a reference frame 132 at a reference gap G. The reference frame 132 is mounted or anchored to a metrology frame MF. In accordance with an embodiment, the reference frame 132 is mounted directly to the metrology frame MF. In this disclosure, for example, the reference frame 132 is mounted to the system metrology frame MF.

Although the reference nozzle 130 is positioned above the reference surface 134 at a reference gap G, the reference nozzle is configured for movement relative to the reference surface 134 and reference frame 132, as well as metrology frame MF.

The measurement nozzle 128 is positioned above a measurement surface. For example, the measurement nozzle 128 is provided relative to a surface of a substrate (substrate W) supported on a substrate table WT or stage and that is configured for exposure to a patterned beam of radiation. The measurement nozzle 128 is positioned above the measurement surface of the substrate W at an unknown gap G2.

In embodiments, the reference gap G may be set to a desired value based on a backflow pressure measured by the sensor 138. That is, the gas pressure Pref upstream of the reference nozzle 130 is a function of the reference gap G. In an embodiment, the gap G2 may set to a desired value based on a backflow pressure measured by the sensor 138. That is, the gas pressure Pmea upstream of the measurement nozzle 128 is a function of the gap G2.

As shown, the nozzles 128, 130 point in a same direction so that if backflow pressures are altered or changed in the same way, e.g., potentially due to small residual motions of reference frame 100, the relative pressure difference detected by the sensor 138 in the bridge channel 136 cancels out, and results in a null condition. Accordingly, if backflow pressures impinged upon the reference surfaces are substantially equal, the configuration is symmetrical and the bridge is balanced. Consequently, there is no substantial differential gas flow through the bridge channel 136. The sensor 138 will detect no difference because there will be no substantial pressure difference between the pressure Pmea and Pref in the measurement and the reference channels 116 and 118.

On the other hand, when gaps G and G2 are varied in an unequal way (e.g., there is difference in variation of each of the gaps G and G2), for example, the resulting backflow and pressure difference between the measurement channel 116 and the reference channel 118 induces a (back) flow of gas through the bridge channel and to the sensor 138.

As previously noted, the sensor 138 is located along the bridge channel 136, which may be at a central point. The pressure sensor 138 may sense a gas flow induced by pressure differences between the measurement channel 116 and the reference channel 118 (Pmea does not equal Pref). These pressure differences may occur as a result of changes in the vertical positioning (in the Z direction) of the target surface, for example.

In an embodiment, the difference in gas pressures Pmea and Pref is proportional to the difference in the gaps G2 and G.

When a pressure imbalance exists, the sensor 138 detects a resulting gas flow, and may initiate an appropriate control function, which may be done using an optional controller C that is coupled to appropriate parts of the system 100 and/or actuator(s) 110. Proper offsets may be introduced for an asymmetric arrangement. In an embodiment, the sensor 138 may provide an indication of a sensed flow through a visual display and/or audio indication, for example, which may be done through use of an output device (not shown).

As previously noted, the controller C may be used to determine or calculate exact gap differences based on the determined measurements, and adjust the relative position(s) between the target surface (e.g., via movement of the substrate table WT) and the measurement platform 100 (e.g., via movement of the platform by actuator(s) 100) so that the gap G2 is controlled when noted differences are determined. For example, the measurement platform 100 may be held substantially stationary in place (e.g., within 1 μm) with respect to the metrology frame MF, while gas gauge(s) is employed for measuring changes. Alternatively, a servo may be used to hold gas gauge(s) such that the reference gap is substantially fixed (e.g., within 1 μm) relative to the measurement surface 132, and changes are tracked with respect to metrology frame MF. By moving the target surface relative to the measurement nozzle 128, the pressure difference may be measured until the difference between Pref and Pmea is sufficiently close to, or equal to, zero (which may occur when there is no longer a difference between the gaps G2 and G). Of course, it should be understood that movement of the target surface and/or measurement platform also include their movement with respect to the metrology frame MF.

Gas gauges operate at very small gaps. In an embodiment, to stabilize the gaps between the gas gauge/measurement platform 100, and to accommodate movement of the substrate table WT, one or more actuators 110 are provided. FIG. 4 shows an example of the gas gauge of FIG. 3 provided in an apparatus with a metrology frame MF and reference frame 132.

As shown, the actuator(s) 110 connects to the measurement platform 100 (or gas gauge) and is designed to move (e.g., extend or retract) the measurement platform 100 relative to the metrology frame MF and target surface, in order to measure topography and to maneuver the gas gauge away from the target surface in the event of a fault, for example. In an embodiment, the actuator(s) 110 may be used under certain conditions to move the measurement platform 110 away from the target surface or substrate table WT, such as during loading of a new substrate onto the substrate table WT for exposure, adjustments to the apparatus or its parts, and/or when fixing problems in the system or parts.

Figure 5:
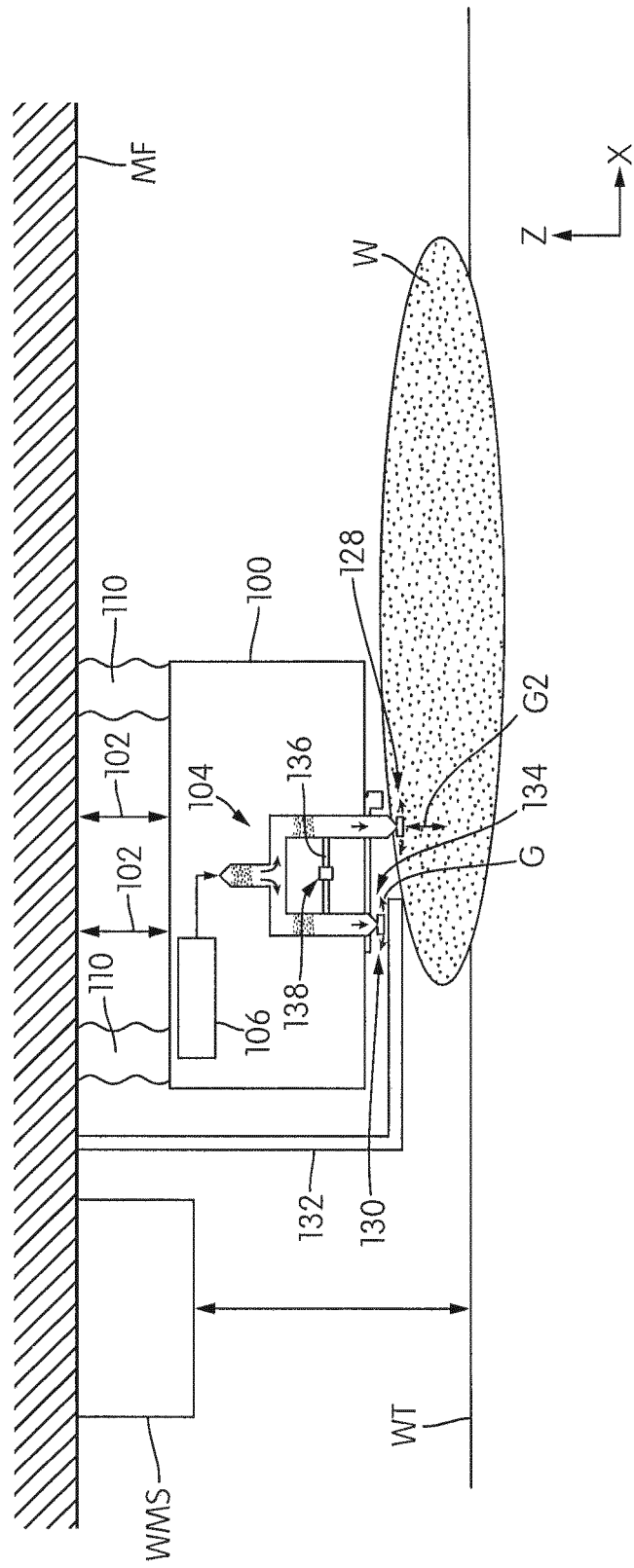
FIG. 5 shows a schematic view of the gas gauge of FIG. 3 provided in an apparatus along with a reference frame according to an embodiment of the disclosure.

FIG. 5 also shows a schematic view of the reference frame 132 mounted to the metrology frame MF. Thus, as the gas gauge body and its associated parts are moved via the one or more actuators 110, both the measure and reference gaps G2 and G (respectively) may be affected. That is, both of the measurement and reference nozzles 128 and 130 may be moved relative to their surfaces (target surface and reference surface 134 (respectively)). Accordingly, any motion of the measurement and reference nozzles 128 and 130 is canceled out by common mode rejection. As such, noise may be substantially eliminated and/or additional sensor noise, drift, or non-linearity may be limited.

Figure 6:
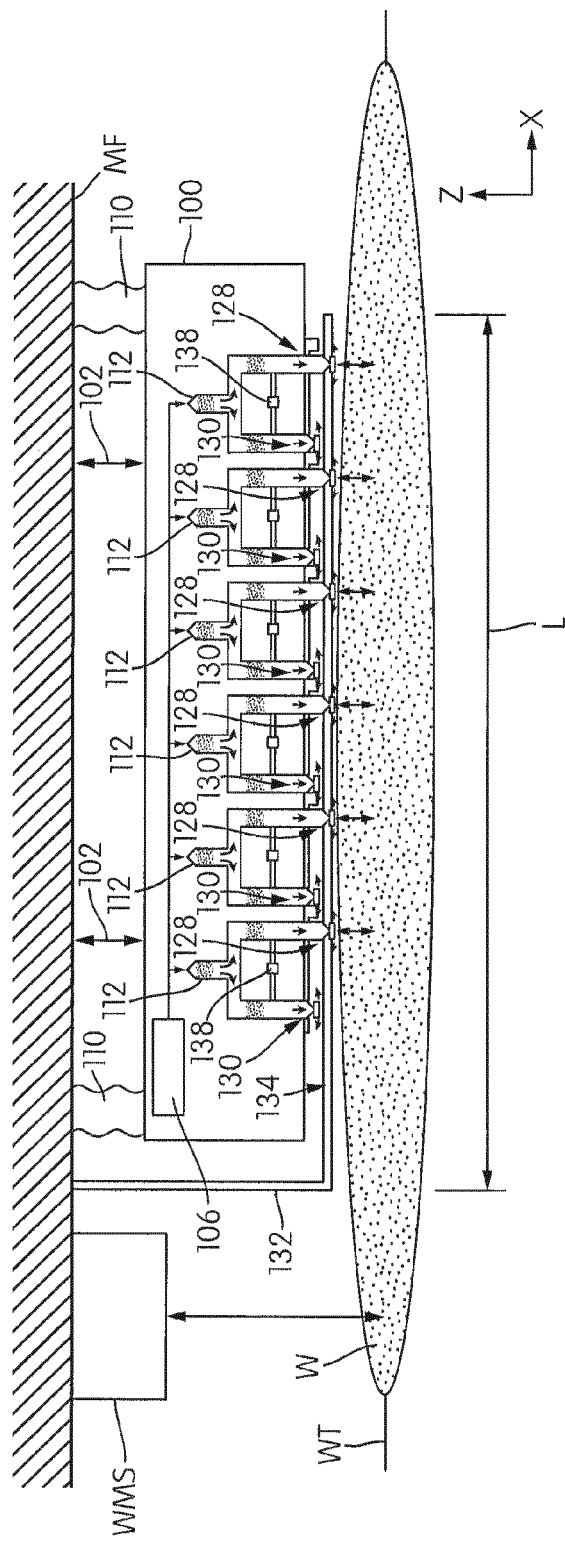
FIG. 6 shows a schematic view of an array of gas gauges provided in an apparatus along with a reference frame in a first direction according to an embodiment of the disclosure.
Figure 7:
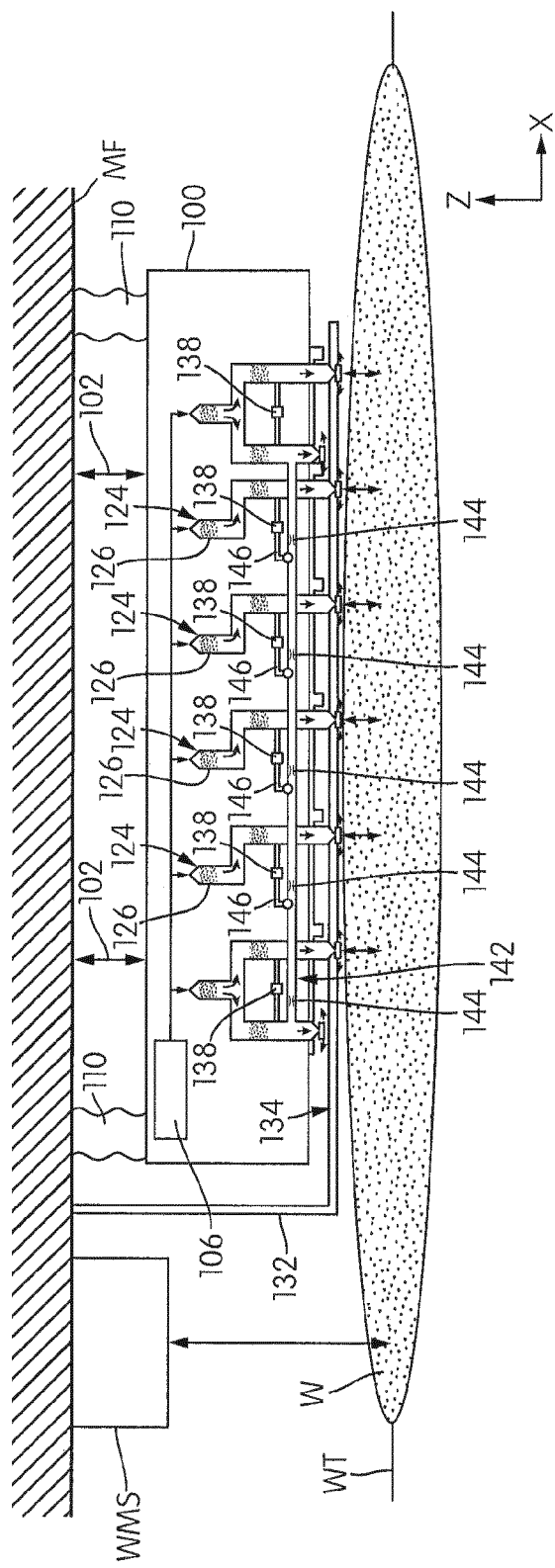
FIG. 7 shows a schematic view of an array of gas gauges provided in an apparatus along with a reference frame in the first direction according to another embodiment of the disclosure.
Figure 8:
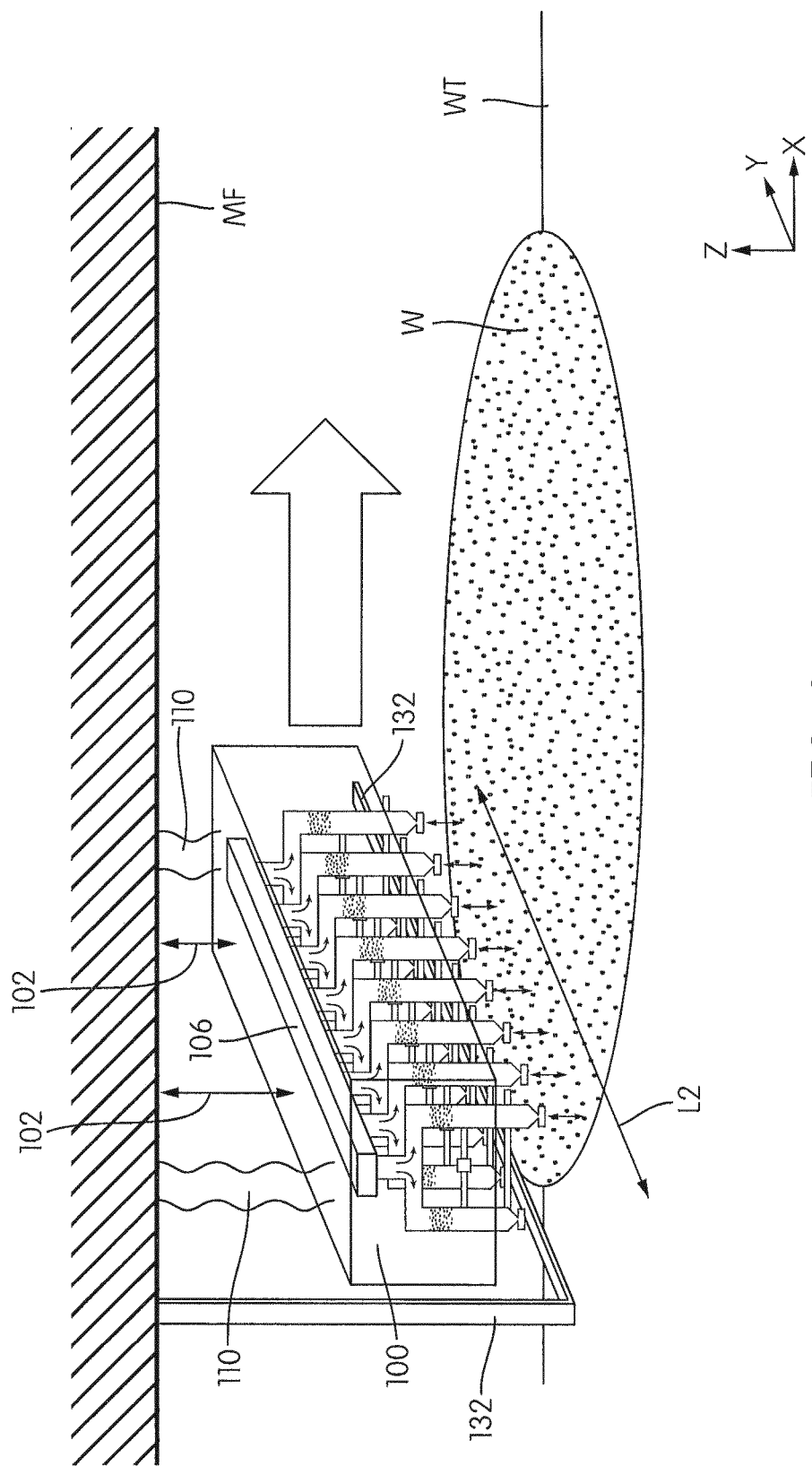
FIG. 8 shows a schematic view of an array of gas gauges provided in an apparatus along with a reference frame in a second direction according to another embodiment of the disclosure.

The above described concept may also be carried in a multi-nozzle application. For example, in some applications, utilizing a single nozzle gauge may have limitations with regards to throughput, and/or may only be used for a send head calibration to a system that uses other sensors as a primary topographic sensor. Employing multiple nozzles allows for multiple surface measurements in parallel time and increases productivity such that the gas gauges may function as a primary sensor. FIGS. 6-8 illustrate exemplary embodiments using multiple nozzles of one or more gas gauges.

As shown in FIGS. 6-8, for example, the measurement platform 100 may include multiple gas gauges in the apparatus. Each of the gas gauges are connected to the gas supply 106 for receipt of gas. In accordance with an embodiment, the gas gauges are positioned in an array extending in a direction that is substantially parallel to a plane of the substrate table WT. The array may be used to measure target surface topography in a faster manner than one gauge alone.

In an embodiment, each of the gas gauges in the array is movable relative to the reference frame 132, metrology frame MF, and target surface. One or more actuators 110 may be provided to extend or retract the entire array (as a group) relative to the metrology frame MF, for example. Alternatively, each gas gauge or a group of gas gauges may have its own actuator such that they can be independently moved.

FIG. 6 illustrates an assembly of an array of gas gauges in a first direction in accordance with one embodiment, and FIG. 7 illustrates an assembly of another array of gas gauges in the first direction in accordance with another embodiment. FIG. 8 illustrates an assembly of an array of gas gauges in a second direction in accordance with another embodiment.

As shown in FIG. 6, at least a portion of the reference frame 132 may be configured to extend a length L relative (e.g., substantially parallel) to the substrate table WT, in the first direction (X direction). Also in the illustrative embodiment of FIG. 6, each of the gas gauges includes a reference nozzle 130 configured to provide gas to the reference surface 134 of the reference frame 132 and a measurement nozzle 128 configured to provide gas to a target surface (e.g., of the substrate W supported on the substrate table WT). Each gas gauge may independently reference the metrology frame MF. Accordingly, the backflow pressure measurements from each of the gas gauges relative to the reference surface 134 and the surface of the substrate W may be used to determine and adjust a relative position of the substrate table WT and the measurement platform 100 (e.g., in the Z-direction). In an embodiment, there may be provided a plurality of reference frames 132, e.g., for each gas gauge or for each group of a plurality of gas gauges.

In the embodiment shown in FIG. 7, at least a portion of the reference frame 132 may be configured to extend a length relative (e.g., substantially parallel) to the substrate table WT, in the first direction (X direction). Also in the illustrative embodiment of FIG. 7, each of the gas gauges includes a reference nozzle 130 configured to provide gas to the reference surface 134 of the reference frame 132 and a measurement nozzle 128 configured to provide gas to a target surface (e.g., of the substrate W supported on the substrate table WT) in a substantially linear fashion in the X direction. Each gas gauge may independently reference the metrology frame MF. Accordingly, the backflow pressure measurements from each of the gas gauges relative to the reference surface 134 and the target surface may be used to determine and adjust a relative position between the target surface and the measurement platform 100 (e.g., in the Z-direction).

In the embodiment shown in FIG. 8, at least a portion of the reference frame 132 may be configured to extend a length L2 relative (e.g., substantially parallel) to the substrate table WT, in the second direction (Y direction). Also in the illustrative embodiment of FIG. 8, each of the gas gauges includes a reference nozzle 130 configured to provide gas to the reference surface 134 of the reference frame 132 and a measurement nozzle 128 configured to provide gas to a target surface (e.g., of the substrate W supported on the substrate table WT) in a substantially linear fashion in the Y direction. As shown, the gas gauges of FIG. 8 may positioned in a parallel manner relative to one another. Each gas gauge may independently reference the metrology frame MF. In an embodiment, the target surface moves in a direction substantially perpendicular to the direction of mounting of the gas gauges, e.g., the X direction. Additionally or alternatively, in an embodiment, the gauges are configured for movement in a direction substantially perpendicular to their direction of mounting. For example, with reference to FIG. 8, which depicts the gas gauges mounted in a parallel manner relative to one another in the Y direction, the gas gauges may be configured for movement across the substrate W on the substrate table WT in the X direction (as indicated by the arrow). Accordingly, the backflow pressure measurements from each of the gas gauges relative to the reference surface 134 and the surface of the substrate W may be used to determine and adjust a relative position between the target surface and the measurement platform 100 (e.g., in the Z-direction).

The gas gauges utilized and configured for measurement in the illustrative embodiment of FIG. 8 may include gauges such as those shown and described with reference to FIG. 7, extending a length L2 relative to the substrate table WT in the Y-direction, in accordance with an embodiment. In another embodiment, the gas gauges utilized and configured for measurement in the illustrative embodiment of FIG. 8 may include gauges such as those shown and described with reference to FIG. 6, extending a length L relative to the substrate table WT in the X-direction.

The embodiments of FIG. 6 and FIG. 7, and FIG. 8 provide similar improvements as noted with respect to the configuration of FIG. 4. For example, since the gas gauge reference target (reference surface 134 of the reference frame 132) is fixed to metrology frame MF, any extend/retract perturbations or residual motions are common to both reference and measure gaps in each nozzle, and thus cancel each other out.

Figure 9:
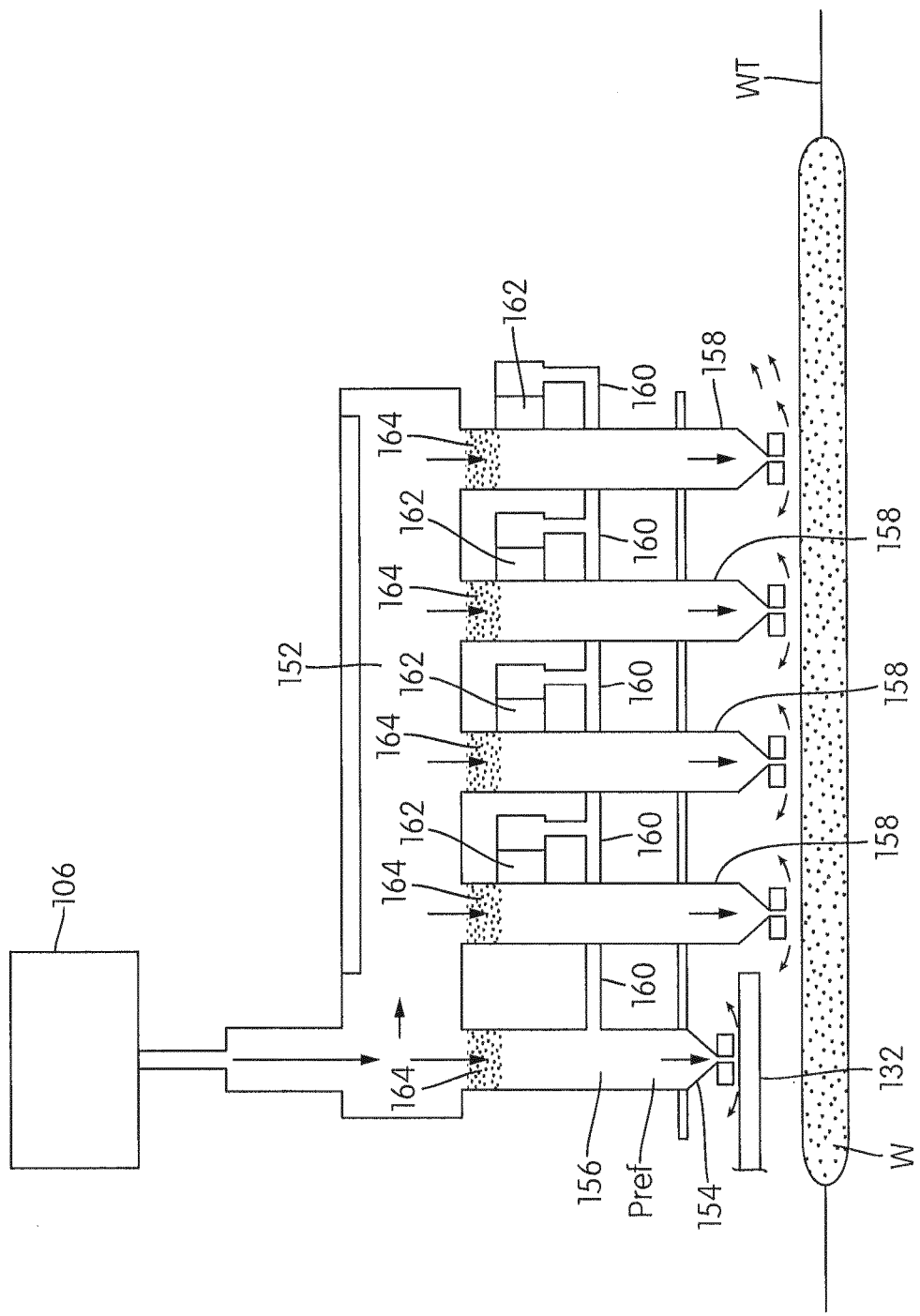
FIG. 9 is a schematic view of a gas gauge with multiple measurement nozzles for use in an apparatus according to an embodiment of the disclosure.
Figure 10:
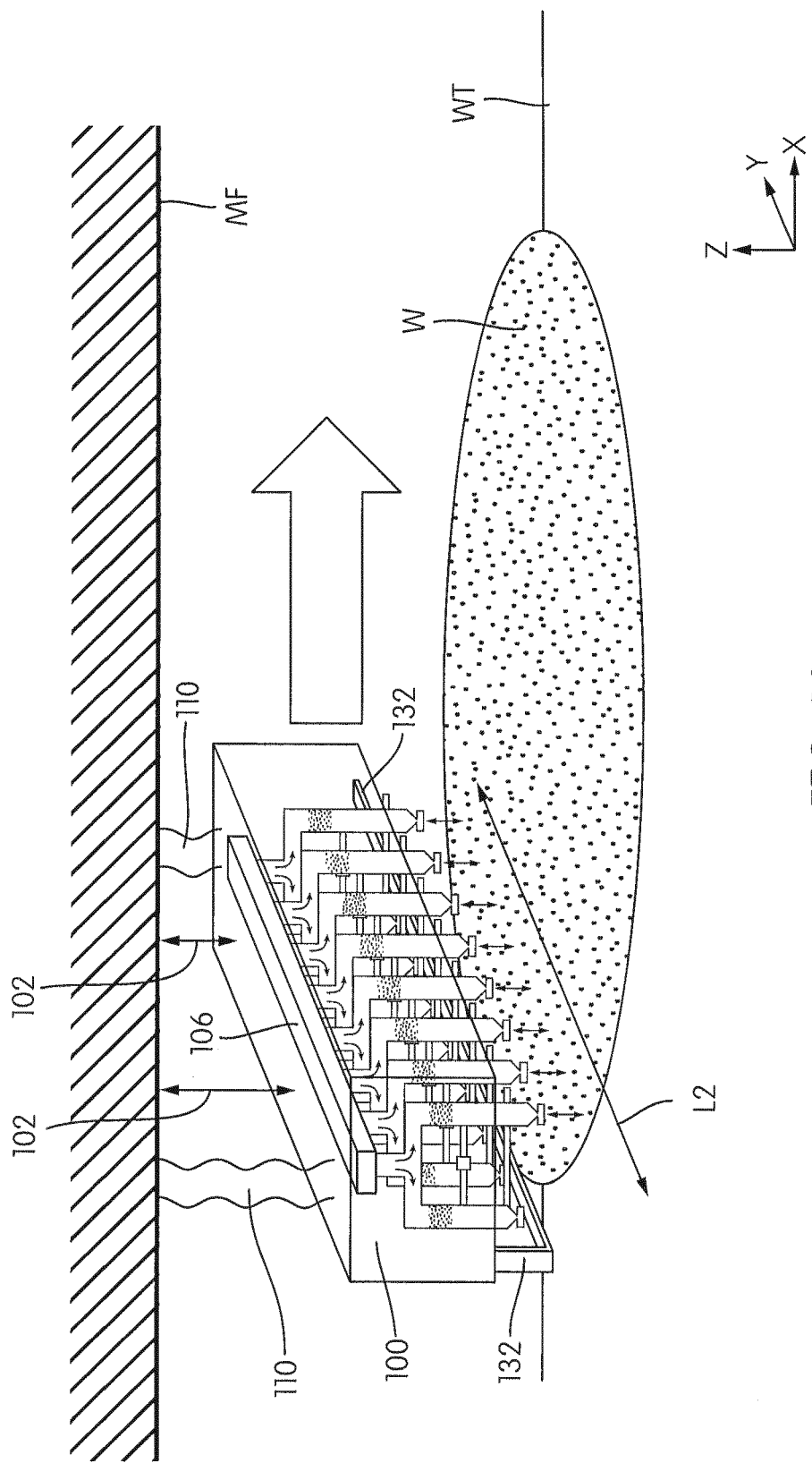
FIG. 10 shows a schematic view of an array of gas gauges provided in an apparatus along with an alternate reference frame in a second direction according to another embodiment of the disclosure.

In another embodiment, shown in FIG. 10, the reference frame 132 and its reference surface 134 are mounted or anchored to the gas gauge/measurement platform 100, such that the reference frame 132 is configured for movement with the platform 100. In accordance with an embodiment, part of the reference frame 132 is mounted directly to the measurement platform 100. The measurement platform has multiple gas gauges positioned in an array extending in a direction that is substantially parallel to the measured surface (e.g., of the substrate W) and that is movable relative to the metrology frame MF and substrate W. In an embodiment, the multiple gas gauges are movable as a unit or individually movable (as single gas gauges or groups of gas gauges) relative to the metrology frame and/or measurement platform 100. The measurement platform 100 has at least one reference nozzle (e.g., such as shown in FIG. 7 or FIG. 9) configured to provide gas (from the gas supply 106) to the reference surface 134 of the reference frame 132. For example, each of the gas gauges may fluidly connected to the reference nozzle of the gas gauge. The gas gauges each include a measurement nozzle 128 positioned above the measurement surface at a respective unknown gap G2. The reference nozzle 130 is positioned above the reference surface 134 at a reference gap G. In one embodiment, each of the gas gauges associated with the measurement platform 100 of FIG. 10 may include its own measurement nozzle 128 and reference nozzle 130. Gas injected by the gas supply 106 is emitted from the nozzles 128 and 130 (e.g., in a substantially constant flow), and impinges upon a measured surface and upon a reference surface 134 of a reference frame 132, respectively.

One or more actuators 110 are configured to move the measurement platform 100—and the reference frame 132—relative to the metrology frame MF. One or more actuators 110 may be provided to extend or retract the entire array (as a group) relative to the metrology frame MF, for example. Alternatively, each gas gauge (or groups of gas gauges) may have its own actuator. The reference nozzle(s) 130 of FIG. 10 does not move relative to the reference surface 134 and reference frame 132, although the measurement platform 100 and/or each of the gas gauges may be moved relative to the metrology frame MF. Thus, as the gas gauge body(ies) and its associated parts are moved via the one or more actuators 110, the measurement gap G2 may be affected. That is, the measurement nozzle 128 may be moved relative to its surface (surface of substrate W), while the gap G between the reference nozzle 130 and reference surface 134 remains substantially unaffected.

In the embodiment shown in FIG. 10, at least a portion of the reference frame 132 may be configured to extend a length L2 relative (e.g., substantially parallel) to the substrate table WT, in the second direction (Y direction). Also in the illustrative embodiment of FIG. 10, each of the gas gauges includes a reference nozzle 130 configured to provide gas to the reference surface 134 of the reference frame 132 and a measurement nozzle 128 configured to provide gas to a target surface (e.g., of the substrate W supported on the substrate table WT) in a substantially linear fashion in the Y direction. As shown, the gas gauges of FIG. 10 may positioned in a parallel manner relative to one another. In an embodiment, the target surface moves in a direction substantially perpendicular to the direction of mounting of the gas gauges, e.g., the X direction. Additionally or alternatively, in an embodiment, the gauges are configured for movement in a direction substantially perpendicular to their direction of mounting. For example, with reference to FIG. 10, which depicts the gas gauges mounted in a parallel manner relative to one another in the Y direction, the gas gauges may be configured for movement across the substrate W on the substrate table WT in the X direction (as indicated by the arrow).

Accordingly, the backflow pressure measurements from each of the gas gauges relative to the reference surface 134 and the surface of the substrate W may be used to determine and adjust a relative position between the target surface and the measurement platform 100 (e.g., in the Z-direction).

In another embodiment, the gas gauges utilized and configured for measurement in the illustrative embodiment of FIG. 10 may include gauges such as those shown and described with reference to FIG. 6, extending a length L relative to the substrate table WT in the X-direction.

In an embodiment, at least one of the of gas gauges (in any of the above described embodiments) further includes a MEMs sensor as sensor 138 to sense any difference in backflow pressure in the gauges. In an embodiment, each of the of gas gauges (in any of the above described embodiments) further includes a MEMs sensor as sensor 138 to sense any difference in backflow pressure in the gauges.

In an embodiment, two gas gauges are provided with reference nozzles at either end of the array, with a number of measurement nozzles therebetween that are connected to the reference nozzles of the two end gas gauges. This provides a simpler design, since all motions of the array are defined by a line (e.g., substantially parallel to a plane along a top of the substrate table WT).

As shown in FIG. 7, for example, each gas nozzle at the respective ends of the array includes a reference nozzle 130 that is configured to provide gas to the reference surface 134 of the reference frame 132 and a measurement nozzle 128 configured to provide gas to the target surface. A number of additional nozzles, or measurement nozzles 124, are provided in the array between the two end gas gauges. Each of the measurement nozzles 124 may be movable (e.g., with the array) relative to the reference frame 132, metrology frame MF, and target surface. Each measurement nozzle 124 includes a single measurement channel 126. Each measurement nozzle 124 is connected to the gas supply 106 for receipt of a substantially constant flow of gas. The measurement channel 126 of each measurement nozzle 124 may contain one or more restrictive elements to restrict the flow of gas traveling through the respective measurement channel 126. Like measurement nozzles 128, these measurement nozzles 124 are provided to distribute gas towards an associated measured surface, e.g., towards the surface of substrate W.

In addition, each of the measurement nozzles 124 is fluidly connected to the reference nozzles 130 of the gas gauges at either end of the array. For example, in the illustrative embodiment of FIG. 7, each of the measurement nozzles 124 may be connected via a common fluid connection channel 142 that is configured to distribute gas from the gas supply 106 across the array. As shown, the connection channel 142 may be connected to the reference channels 118 of each of the gas gauges provided at either end of the array. The connection channel 142 is designed to calibrate and distribute the gas pressure used for reference (as needed). For example, a series of restrictive elements 144 may be provided throughout the channel 142 to restrict and distribute pressure among the nozzles 124. In the embodiment illustrated in FIG. 7, the flow is initiated in a direction from the left side to the right side, and divides the gas flow and pressure Pref amongst the array of nozzles. For example, in such a construction, the end reference gaps may have different pressures reflecting their different gaps, but those pressures may be distributed along the measurement nozzles 124 that lie in between. In an embodiment, the pressure is distributed substantially evenly amongst the array of nozzles. If the end reference gaps (i.e., Pref measurements) are equal, then no flow through connection channel 142 is necessary.

Each measurement nozzle 124 may include a measurement bridge channel 146 that is designed to determine a difference in pressure between the connection channel 142 (e.g., before each of the restrictive elements 144) and the measurement channel 126. The bridge channel 146 is coupled between the measurement channel 126 and the connection channel 142. The bridge channel 146 receives backflow of gas pressure from the connection channel 142.

In an embodiment, each of the of measurement nozzles 124 includes an associated sensor 138 to sense a difference in backflow pressure. Accordingly, the sensor 138 associated with each measurement nozzle 124 may detect a gas flow in either direction from the connection channel 142 and the measurement channel 126. The sensors 138 may be used along with the end gas gauges to detect an imbalance.

The embodiment of FIG. 7 and FIG. 8 provides similar improvements as noted above.

For example, any perturbations or residual motions are common to both reference and measure gaps in each nozzle (connected via a network/connection channel 142 that distributes the reference pressures over the array of gas gauges) and thus cancel out.

It should be noted that the number of nozzles and/or gas gauges in the embodiments shown in FIGS. 6, 7, 8, 9 and/or FIG. 10 is not intended to be limited. That is, the number of nozzles and/or gas gauges may include any number, such as thirty or more, for example. Further, the design of the array is not intended to be limiting. For example, arrays in two dimensions (e.g., X and Y directions—or a combination of the nozzles illustrated in FIGS. 6, 7, 8, 9 or FIG. 10) as well as those in a single line or plane may be implemented. Also, gas gauges with reference nozzles 130 may be spaced throughout the array amongst a number of measurement nozzles 124 (e.g., every other nozzle, or third nozzle, etc.).

The movement of the gas nozzles and/or measurement platform 100 is also not intended to be limiting. In an embodiment, the measurement platform 100 may rotate (e.g., clockwise) relative to the metrology frame MF and substrate stage WT.

Accordingly, in the above described embodiments, the gas gauge reference target (reference surface 134) is fixed relative to the metrology frame MF when measurements are taken such that perturbations or motions (such as those initiated by actuator 110) are common mode to both reference and measure gaps G and G2, and thus canceled.

By using the configuration of this disclosure, the gas gauge(s)/measurement platform 100 is configured to maintain the target surface at a desirable position. This disclosure is capable of measuring very miniscule changes (e.g., on the order of several nanometers) in the relative distance between the target surface and the gas gauge/measurement platform 100, and produces a more accurate reading. The gas gauge/measurement platform 100 may be moved or servoed as the distance between the gas gauge and the target surface changes (as detected by the difference in backflow pressure). Any desired characteristics of the gas gauge are preserved, while perfectly linear readings may be maintained. At the same time, the risk of a collision between the gas gauge nozzle and the target surface may essentially be eliminated.

Although, for purposes of illustration only, the movement of the substrate stage WT is noted throughout with respect to two degrees or directions, e.g., along a vertical (Z) axis relative to a horizontal surface (in the X-direction), in practice, one of ordinary skill in the art understands that the substrate stage WT may be moveable in six degrees of freedom. Accordingly, adjustments may be made to accommodate tilt or angles of the stage as determined by the disclosed measurement platform 100 (including one or more gas gauges).

Additionally, the disclosed concepts may be implemented in both vacuum based gas gauges and atmospheric based designs.

However, it is noted that when multiple nozzles and/or an array of nozzles is implemented, isolation between the nozzles to the external environment may be desirable. Depending on the environment—vacuum or atmosphere—and system, different means may be used for isolating each nozzle, such that the sensed measurements are not further compromised.

Figure 11:
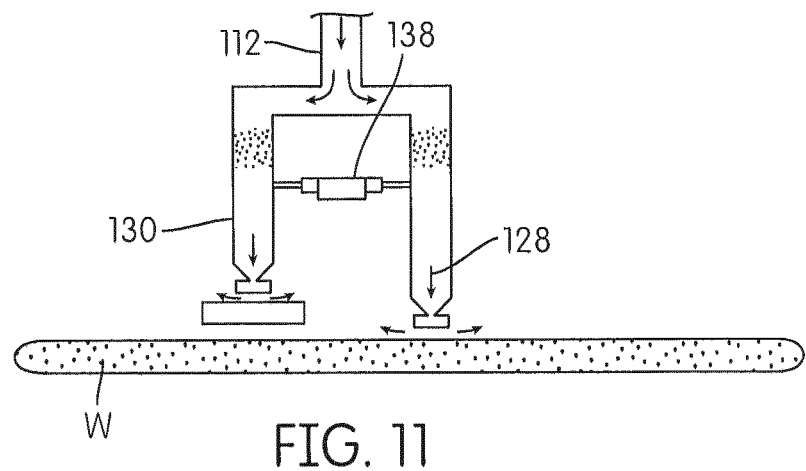
FIG. 11 is a schematic view of a gas gauge used in an apparatus in a low pressure (e.g., vacuum) environment according to an embodiment of the disclosure.

FIG. 11 illustrates an exemplary gas gauge used in a vacuum system or apparatus in a vacuum environment according to an embodiment of the disclosure. Although not shown here, it should be understood that the gas gauge of FIG. 11 may be provided in an array. In such a vacuum environment, isolation is a result of shock conditions at the outlet of the measurement nozzle 128. A shock wave is present at the nozzle exit port under such vacuum conditions. On the other hand, in an atmospheric system exposed to the atmosphere, such shock conditions are not present. Accordingly, using multiple nozzles in an atmospheric environment, a common shroud may be provided as part of the measurement platform 100 to isolate the reference and measurement nozzles of one gas gauge from the nozzles of another gas gauge, so that inter nozzle isolation is achieved. In one embodiment, as illustrated by the cross-section in FIG. 12, a shroud 148 may be positioned to encase at least a portion of the reference nozzle 130 and the measurement nozzle 128 of each gas gauge of the measurement platform (to isolate the nozzles 128, 130 of one gas gauge from those of another, adjacent gas gauge). In another embodiment, as illustrated by the cross-section in FIG. 13, a shroud 150 may be configured to encase substantially the entire gas gauge (from an adjacent gas gauge), including the nozzles 128 and 130. Although only shown schematically in cross-section in FIGS. 12 and 13, it should be understood that the shrouds 148 and 150 may include, e.g., four walls to form a box or rectangular-like shape or a single curved wall to form a cylinder- or dome-type shape, so to substantially surround all sides of the nozzles 128, 130 and/or gas gauges to encase and isolate adjacent nozzles from each other, so that errors in measurements may be reduced.

In accordance with another embodiment, additional optimization for vacuum systems may include a gas gauge designed such that multiple measurement nozzles share a common reference nozzle, thereby reducing flow. In a similar manner as described with reference to the embodiment illustrated in FIG. 7, a number of measurement nozzles may be provided in an array, but restricted to communication with a single common reference nozzle. FIG. 9 illustrates an example of such a gas gauge that may be used on the measurement platform 100 in accordance with an embodiment. The illustrated gas gauge of FIG. 9 may be solely utilized in an apparatus for measuring a target surface, or, in some embodiments, multiple gas gauges such as those illustrated in FIG. 9, may be used for measuring the target surface.

Figure 12:
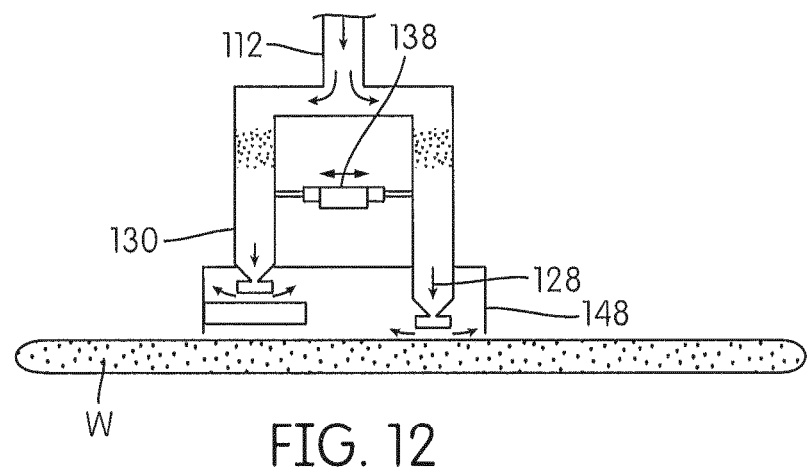
FIG. 12 is a schematic view of a gas gauge and cross-sectional view of a shroud used in an apparatus in an atmospheric environment according to an embodiment of the disclosure.
Figure 13:
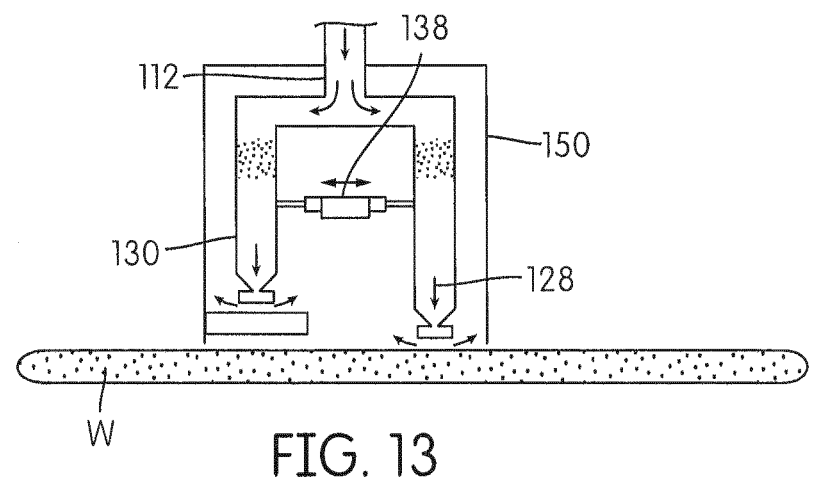
FIG. 13 is a schematic view of a gas gauge and cross-sectional view of a shroud used in an apparatus in an atmospheric environment according to another embodiment of the disclosure.

As shown, gas supply 106 is connected to the gas gauge and configured to distribute gas to a common supply chamber 152. A reference nozzle 154 is configured to receive gas within its measurement channel 156 from the common supply chamber 152, and provide the gas to the reference surface of the reference frame 132. A number of measurement nozzles 158, positioned in an array, are also connected to the common supply chamber 152 (solely as an illustrative example, four are shown in FIG. 9). Each measurement nozzle 158 is configured to provide gas to the target surface. The measurement nozzles 158 are movable with the gas gauge relative to the reference frame 132, metrology frame MF, and target surface. Each measurement nozzle 158 includes a single measurement channel. Each measurement nozzle 158 is connected to the gas supply 106 for receipt of a substantially constant flow of gas. The measurement channel of each measurement nozzle 158 may contain one or more restrictive elements 164 associated therewith to restrict the flow of gas traveling through the respective measurement channel. The channel 156 of the reference nozzle 154 may also or alternatively include a restrictive element 164 associated therewith. For example, as shown in FIG. 12, the restrictive element(s) 164 may be provided at or near an entrance point of a channel, adjacent to the common supply chamber 152.

In addition, each of the measurement nozzles 158 is fluidly connected to the reference nozzle 154 of the gas gauge. For example, in the illustrative embodiment of FIG. 9, each of the measurement nozzles 158 is connected via a common fluid connection channel 160 that is configured to distribute gas from the gas supply 106 across the array of nozzles. The connection channel 160 is designed to distribute the gas pressure used for reference (as needed), so that a difference in pressure between the channel in each of the measurement nozzles and the measurement channel 156 of the reference nozzle 154 may be determined. In an embodiment, each of the measurement nozzles 158 includes an associated pressure or flow sensor 162 (e.g., a MEMs sensor) to sense a difference in backflow pressure. The sensor receives backflow of gas pressure from the connection channel 160. Accordingly, the sensor 162 associated with each measurement nozzle 158 may detect a gas flow in either direction from the connection channel 160 and the measurement channel of each nozzle. The sensors 162 may be used to detect an imbalance with reference to a common reference gap provided by the reference nozzle 154.

Accordingly, an array of gas gauges or an array of nozzles may be used as a primary topographic mapping mechanism for a substrate.

Gas gauge bandwidth is a factor in determining the technology's productivity. Bandwidths of 2 kHz may be required in order to, for example, create a topographic map of the substrate in a reasonable time period. The herein disclosed gas gauge(s) and systems are designed to accurately measure substrate height (or height map of the substrate W), independent of the processing at the substrate, in a short or limited amount of time. The gas gauge bandwidth and settling time can be significant to support the speed at which the substrate is moved (e.g., scan speed), and to limit the settling time after the substrate W is moved from underneath the gas gauge(s).

Figure 14:
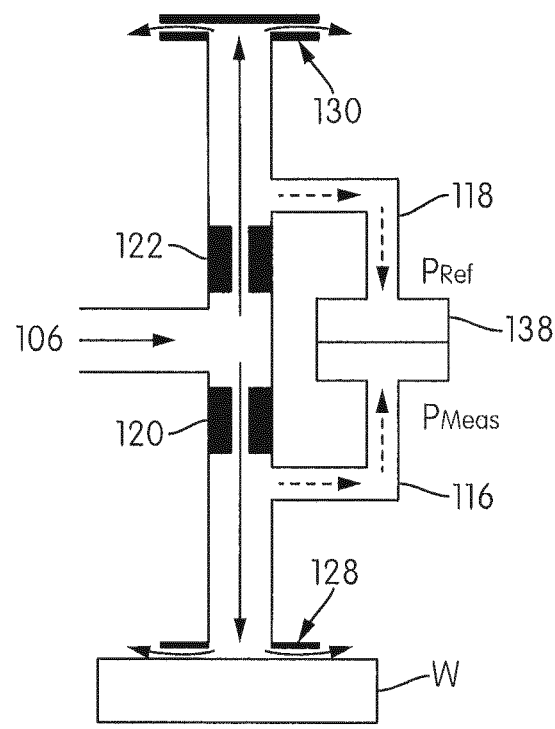
FIG. 14 shows a schematic view of a gas gauge which may be provided in the measurement platform of FIG. 2 according to an embodiment of the disclosure.
Figure 15:
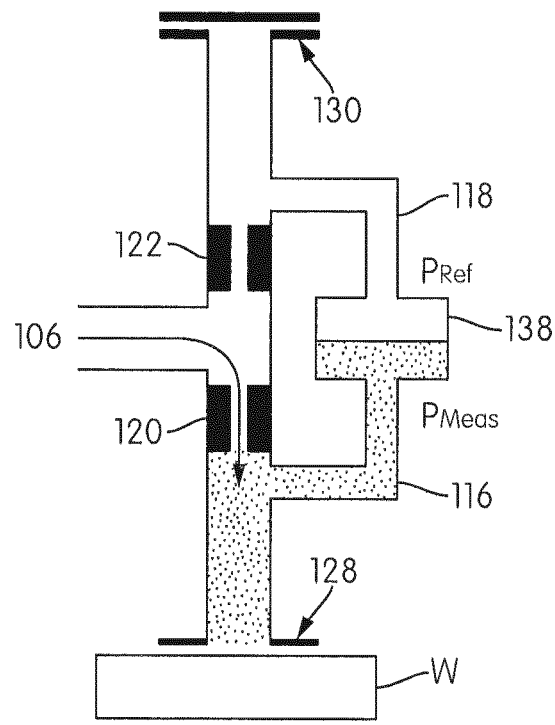
FIG. 15 shows a schematic view of a measurement volume of a measurement side of the schematic gas gauge of FIG. 14.
Figure 16:
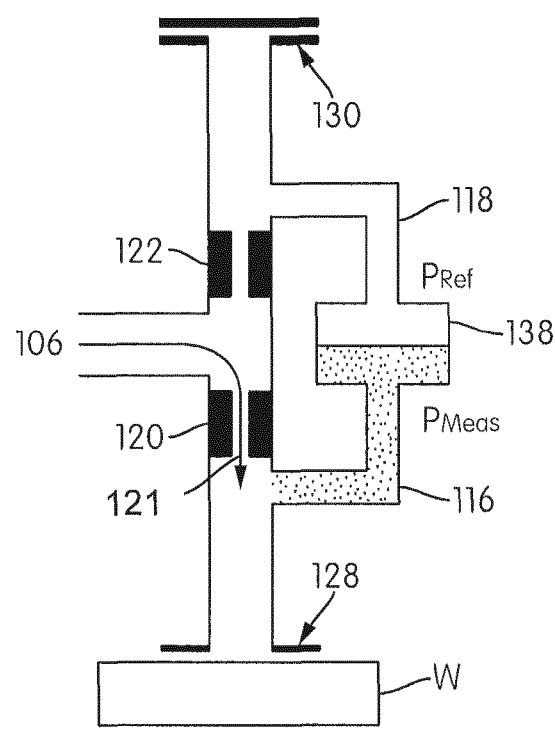
FIG. 16 shows a schematic view of a volume of a measurement channel and sensor in the schematic gas gauge of FIG. 14.

Within the channels, conduits, or nozzles, however, there may be several causes that lead to bandwidth limitations for a gas gauge measurement system. For example, FIG. 14 illustrates a working principle of a gas gauge in a slightly different manner than what is shown in FIG. 3, but based on the same concepts, e.g., utilizing a differential pressure sensor 138 to measure a pressure difference in flow into a reference channel 118 and a measurement channel 116, based on gas distributed to the reference nozzle 130 and measurement nozzle 128 from the gas supply 106 (and optionally restricted using restrictors 122, 120). In this type of configuration, the measurement volume of the gas gauge together with the limited (defined) gas flow limits the maximum bandwidth of the gas gauge itself. More specifically, FIG. 15 illustrates how the pressure in the internal volume of the channels or conduits (see shaded area) cannot rise faster than the gas flow or supply from the gas supply 106. That is, the gas gauge has a limited bandwidth, since there will be a volume at the location of the sensor 138 (e.g., within the measurement channel 116). To change the pressure, gas needs to flow to or from this volume to the measurement nozzle 128. However, because the flow of gas from the gas supply is limited by the restrictor 120 (i.e., limited gas flow 121), the maximum pneumatic bandwidth is limited by a distance between the measurement nozzle 128 and the sensor 138, and a volume at the side of the sensor (therebetween), as illustrated by the shaded area in FIG. 16. Accordingly, the measurement channel 116 acts as a restrictor for the volume of gas at the sensor 138. An optimum may be found through optimizing the cross-sectional width (e.g., diameter) of this channel as well as minimizing the volume at the sensor 138.

Optimizing the type of gas for bandwidth could also influence other parameters, including those noted above. Further, the type of gas supplied by the gas supply 106 may further increase the bandwidth of a gas gauge(s) that utilizes the illustrated principles of FIGS. 14-16.

The type of gas to be used in a gas gauge(s) as described herein contributes to the sensitivity and thermal behavior of the gas gauge(s). As previously noted, the type of gas supplied or distributed via gas supply 106 and the gas gauge(s) disclosed herein may vary. To achieve, e.g., a bandwidth of 2 kHz, the type of gas may be selected with such a goal in mind. For example, a bandwidth of 2 kHz may be more difficult to achieve with a nozzle distributing nitrogen ($N_2$) or a nitrogen based gas in lower pressure applications, like an EUV tool.

In accordance with an embodiment, then, it may be desirable to use hydrogen ($H_2$) or hydrogen-based gas in the gas supply 106. This is because the pneumatic response time of a gas gauge can be a function of several parameters. Firstly, the response time is directly proportional to the gas constant "R", of the gas. In this regard, hydrogen ($H_2$) has an R of ~4131 J/(kg K) whereas nitrogen ($N_2$) has an R of ~297 J/(kg/K). As such, hydrogen gas has a gas constant that is about 14 times faster than that of nitrogen gas. Secondly, a gas gauge bandwidth is inversely proportional to the nozzle resistance. Hydrogen ($H_2$) has about ½ the viscosity of nitrogen ($N_2$). Accordingly, using hydrogen ($H_2$) gas in the gas gauge(s) further boosts response time by a factor of about 2. In addition, using a gas with a lower viscosity allows for smaller interconnecting tubes or channels, thus lowering the internal volume, and further increasing the bandwidth of the gas gauge(s). Also, the propagation speed of sound in hydrogen ($H_2$) is about four times faster than the propagation speed of sound in nitrogen ($N_2$). For such reasons, then, in accordance with an embodiment, hydrogen ($H_2$) is used as the gas or operating fluid of the gas gauge(s), since a gas gauge(s) with a higher bandwidth improves productivity. Additionally, having excess bandwidth makes other design aspects, like packaging smaller volumes, easier.

When using hydrogen ($H_2$) gas, for example, the restriction caused by the channels (or restrictors 122, 120) in the gas gauge(s) has less influence, because hydrogen gas will move at a faster speed through the channels (e.g., for the reasons noted above, e.g., less viscosity). Also, the amount of gas in the volume of the sensor 138 may be increased or decreased more quickly when using hydrogen, which results in a faster response time and higher bandwidth.

In another embodiment, the gas may be helium, which has a gas constant significantly higher than that of nitrogen gas.

In an embodiment, the gas provided by gas supply 106 consists essentially of hydrogen ($H_2$) gas. In an embodiment, the gas provided by gas supply 106 consists essentially of helium gas. In an embodiment, the gas provided by gas supply 106 consists essentially of helium and hydrogen gas. In an embodiment, the gas provided by gas supply 106 comprises more than or equal to 10%, more than or equal to 20%, more than or equal to 30%, more than or equal to 40%, more than or equal to 50%, more than or equal to 60%, more than or equal to 70%, more than or equal to 80%, more than or equal to 90%, more than or equal to 95%, or more than or equal to 99% of hydrogen ($H_2$) gas. In an embodiment, the gas provided by gas supply 106 comprises more than or equal to 10%, more than or equal to 20%, more than or equal to 30%, more than or equal to 40%, more than or equal to 50%, more than or equal to 60%, more than or equal to 70%, more than or equal to 80%, more than or equal to 90%, more than or equal to 95%, or more than or equal to 99% of helium gas. In an embodiment, the gas provided by gas supply 106 comprises more than or equal to 10%, more than or equal to 20%, more than or equal to 30%, more than or equal to 40%, more than or equal to 50%, more than or equal to 60%, more than or equal to 70%, more than or equal to 80%, more than or equal to 90%, more than or equal to 95%, or more than or equal to 99% of hydrogen ($H_2$) and helium gas.

Accordingly, although the bandwidth of the gas gauge(s) may still be limited by the distance between the measurement nozzle and sensor of each gauge as well as the volume at the sensor itself, optimizing the type of gas used with the gas gauge, e.g., utilizing hydrogen ($H_2$) or hydrogen-based gas, as opposed to nitrogen ($N_2$) or nitrogen-based gas, increases the bandwidth of the gas gauge(s) as disclosed herein.

In an embodiment, there is provided an apparatus comprising: a metrology frame constructed and arranged as a substantially stationary frame of reference; a reference frame mounted to the metrology frame comprising a reference surface; and a measurement platform comprising a gas gauge, the measurement platform being movable relative to the reference frame, metrology frame, and a measured surface, the gas gauge comprising a reference nozzle configured to provide gas to the reference surface and a measurement nozzle configured to provide the gas to the measured surface.

In an embodiment, the apparatus further comprises a hydrogen and/or helium gas supply configured to provide gas comprising more than or equal to 10% hydrogen and/or helium gas to the gas gauge. In an embodiment, the gas gauge comprises a MEMs sensor that is constructed and arranged to sense a difference in backpressure from each of the reference nozzle and the measurement nozzle. In an embodiment, the apparatus further comprises a controller configured to communicate with the gas gauge and configured to adjust a position of the measurement platform based on the sensed difference. In an embodiment, the apparatus further comprises a measurement system configured to measure a distance of the measurement platform relative to the metrology frame. In an embodiment, the measurement system comprises a digital measurement comprising a digital encoder or a digital heterodyne interferometer. In an embodiment, the apparatus further comprises an actuator configured to move the measurement platform relative to the metrology frame. In an embodiment, the measurement platform comprises an additional gas gauge comprising an additional measurement nozzle configured to provide a gas to the measured surface, wherein the additional gas gauge is fluidly connected to the reference nozzle of the gas gauge. In an embodiment, the measurement platform comprises a plurality of gas gauges each comprising an additional measurement nozzle configured to provide a gas to the measured surface, and wherein the plurality of gas gauges are positioned in an array extending in a direction that is substantially parallel to the measured surface. In an embodiment, each of the plurality of gas gauges further includes a reference nozzle configured to provide gas to the reference surface. In an embodiment, each of the plurality of gas gauges is fluidly connected to the reference nozzle of the gas gauge. In an embodiment, the plurality of gas gauges is connected to the reference nozzle of the gas gauge via a fluid connection channel that is configured to distribute gas across the array. In an embodiment, the apparatus further comprises restrictive elements configured to restrict a flow of gas across the array. In an embodiment, each of the plurality of gas gauges further comprises a MEMs sensor that is constructed and arranged to sense a difference in backpressure. In an embodiment, the apparatus is a lithographic apparatus comprising: a projection system constructed and arranged to receive a patterned radiation beam and project the patterned radiation beam onto a substrate; and a substrate table configured to hold the substrate, wherein a surface of the substrate is the measured surface. In an embodiment, measurements from the gas gauge are used to determine and adjust a relative position of the substrate table and the measurement platform.

In an embodiment, there is provided a method for measuring a surface in an apparatus, the apparatus having a metrology frame constructed and arranged as a substantially stationary frame of reference, a reference frame mounted to the metrology frame comprising a reference surface, and a measurement platform comprising a gas gauge, the measurement platform being movable relative to the reference frame, metrology frame, and a measured surface, and the gas gauge comprising a reference nozzle configured to provide gas to the reference surface and a measurement nozzle configured to provide gas to the measured surface and a sensor; the method comprising: providing gas to the reference nozzle of the gas gauge; providing a substantially constant flow of gas to the measurement nozzle of the gas gauge; and sensing with the sensor a difference in backpressure from each of the reference nozzle and the measurement nozzle, wherein the reference nozzle is configured to provide gas to the reference surface and the measurement nozzle is configured to provide gas to the measured surface.

In an embodiment, the sensing is performed by a MEMs sensor. In an embodiment, the method further comprises adjusting a position of the measurement platform relative to the metrology frame based on the sensed difference using an actuator. In an embodiment, the measurement platform comprises an additional gas gauge comprising an additional measurement nozzle configured to provide a gas to the measured surface, wherein the additional gas gauge is fluidly connected to the reference nozzle of the gas gauge via a fluid connection channel, and wherein the method comprises: providing gas to the additional gas gauge via the fluid connection channel; and providing a substantially constant flow of gas to the measurement nozzle of the additional gas gauge. In an embodiment, the measurement platform comprises a plurality of gas gauges each comprising an additional measurement nozzle configured to provide gas to the measured surface, and wherein the plurality of gas gauges are positioned in an array extending in a direction that is substantially parallel to the measured surface, and wherein the method comprises: providing a substantially constant flow of gas to the plurality of gas gauges. In an embodiment, each of the plurality of gas gauges is fluidly connected to the reference nozzle of the gas gauge via a fluid connection channel that is configured to distribute gas across the array, and wherein the method further comprises distributing the gas across the array. In an embodiment, the fluid connection channel comprises restrictive elements configured to restrict a flow of gas across the array, and wherein the method further comprises restricting the flow of gas across the array. In an embodiment, each of the plurality of gas gauges further comprises a MEMs sensor, and wherein the method further comprises sensing a difference in backpressure in the plurality of gas gauges using the MEMs sensor. In an embodiment, the apparatus is a lithographic apparatus comprising: a projection system constructed and arranged to receive a patterned radiation beam and project the patterned radiation beam onto a substrate; and a substrate table configured to hold the substrate, wherein a surface of the substrate is the measured surface. In an embodiment, measurements from the gas gauge are used to determine and adjust a relative position of the substrate table and the measurement platform, and wherein the method further comprises adjusting a relative position of the substrate table and the measurement platform. In an embodiment, the gas comprises more than or equal to 10% of hydrogen and/or helium gas.

In an embodiment, there is provided a gas gauge comprising: a reference nozzle configured to provide a gas to a reference surface; a measurement nozzle configured to provide the gas to a measured surface; and a MEMs sensor that is constructed and arranged to sense a difference in backpressure from each of the reference nozzle and the measurement nozzle.

In an embodiment, the gas gauge further comprises a controller configured to communicate with the gas gauge and configured to adjust a position of the gas gauge based on the sensed difference. In an embodiment, the gas gauge further comprises an actuator constructed and arranged to move the gas gauge. In an embodiment, the gas gauge further comprises a restrictive element configured to restrict a flow of gas into the reference nozzle and/or measurement nozzle. In an embodiment, the gas gauge is provided in a lithographic apparatus comprising: a projection system constructed and arranged to receive a patterned radiation beam and project the patterned radiation beam onto a substrate; and a substrate table configured to hold the substrate. In an embodiment, the gas comprises more than or equal to 10% hydrogen and/or helium gas.

In an embodiment, there is provided an apparatus comprising: a metrology frame constructed and arranged as a substantially stationary frame of reference; a measurement platform comprising a plurality of gas gauges, the measurement platform being movable relative to metrology frame and a measured surface, each of the gas gauges having a measurement nozzle configured to provide a gas to the measured surface; a reference frame comprising a reference surface mounted to the measurement platform or the metrology frame; wherein the measurement platform comprises a reference nozzle configured to provide gas to the reference surface, and wherein the plurality of gas gauges are positioned in an array extending in a direction that is substantially parallel to the measured surface.

In an embodiment, the apparatus further comprises an actuator configured to move the measurement platform relative to the metrology frame. In an embodiment, each of the plurality of gas gauges is fluidly connected to the reference nozzle of the gas gauge. In an embodiment, each of the plurality of gas gauges further comprises a MEMs sensor that is constructed and arranged to sense a difference in backpressure. In an embodiment, the gas comprises more than or equal to 10% hydrogen and/or helium gas.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Although specific reference may have been made above to the use of embodiments of the invention in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

Moreover, the apparatus may instead be an apparatus used for another purpose, and is not limited for use in photolithography.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Additionally, although not necessarily labeled in each of the Figures, it should be understood that each of the gas gauges is designed to have a difference in pressure Pref and Pmea (as a result of being impinged upon the references surfaces) measured by the nozzles 130 and 128 (or via a single reference nozzle for an array of measurement nozzles) when gas injected by the gas supply 106 emitted therefrom the nozzles 128 and 130 upon a measured surface of a substrate W and a reference surface 134 of a reference frame 132. Based on the detection of sensed difference in pressures, the measured surface, or surface of the substrate W, may have its position adjusted.

While specific embodiments of the invention have been described above, it will be appreciated that embodiments of the invention may be practiced otherwise than as described. For example, an embodiment of the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

The foregoing description of the specific embodiments will so fully reveal the general nature of the disclosure that others may, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The descriptions above are intended to be illustrative, not limiting. Thus, it will be apparent to those skilled in the art that modifications may be made to the invention as described without departing from the scope of the claims set out below.

What is claimed is:

1. An apparatus comprising:
   a metrology frame constructed and arranged as a substantially stationary frame of reference;
   a reference frame mounted to the metrology frame, the reference frame comprising a reference surface; and
   a measurement platform comprising a plurality of gas gauges, the measurement platform being movable relative to the reference frame, metrology frame, and a measured surface, each of the gas gauge comprising a reference nozzle configured to provide gas to the same reference surface and a measurement nozzle configured to provide gas to the measured surface.

2. The apparatus of claim 1, further comprising a hydrogen and/or helium gas supply configured to provide gas comprising more than or equal to 10% hydrogen and/or helium gas to the gas gauges.

3. The apparatus of claim 1, wherein at least one gas gauge of the gas gauges comprises a MEMs sensor that is constructed and arranged to sense a difference in backpressure from each of the reference nozzle and the measurement nozzle.

4. The apparatus of claim 3, further comprising a controller configured to communicate with at least one gas gauge of the gas gauges and configured to adjust a position of the measurement platform based on the sensed difference.

5. The apparatus of claim 1, further comprising a measurement system configured to measure a distance between the measurement platform and the metrology frame.

6. The apparatus of claim 1, further comprising an actuator configured to move the measurement platform relative to the metrology frame.

7. The apparatus of claim 1, wherein the measurement platform comprises an additional gas gauge comprising an additional measurement nozzle configured to provide a gas to the measured surface, wherein the additional gas gauge is fluidly connected to the reference nozzle of at least one of the plurality of gas gauges.

8. The apparatus of claim 1, wherein the plurality of gas gauges are positioned in an array extending in a direction that is substantially parallel to the measured surface.

9. The apparatus of claim 1, wherein the apparatus is a lithographic apparatus comprising:
   a projection system constructed and arranged to receive a patterned radiation beam and project the patterned radiation beam onto a substrate; and
   a substrate table configured to hold the substrate,
   wherein a surface of the substrate and/or substrate table is the measured surface.

10. The apparatus of claim 9, wherein measurements from at least one gas gauge of the plurality of gas gauges are used to determine and adjust a relative position of the substrate table and the measurement platform.

11. A method for measuring a surface in an apparatus, the apparatus having a metrology frame constructed and arranged as a substantially stationary frame of reference, a reference frame mounted to the metrology frame, the reference frame comprising a reference surface, and a measurement platform comprising a plurality of gas gauges, the measurement platform being movable relative to the reference frame, metrology frame, and a measured surface, and each of the gas gauges comprising a reference nozzle configured to provide gas to the same reference surface and a measurement nozzle configured to provide gas to the measured surface, the method comprising:
provide gas to the reference nozzles of the gas gauges;
providing a substantially constant flow of gas to the measurement nozzles of the gas gauges; and
sensing with a sensor a difference in backpressure from each of the reference nozzles and the measurement nozzles,
wherein the reference nozzles are configured to provide gas to the same reference surface and the measurement nozzles are configured to provide gas to the measured surface.

12. A gas gauge comprising:
a reference nozzle configured to provide gas to a reference surface;
a measurement nozzle configured to provide gas to a measured surface; and
a MEMs sensor that is constructed and arranged to sense a difference in backpressure from each of the reference nozzle and the measurement nozzle, the MEMs sensor having an internal volume of about 1 mm$^3$ or less.

13. The gas gauge of claim 12, further comprising a controller configured to communicate with the gas gauge and configured to adjust a position of the gas gauge based on the sensed difference.

14. The gas gauge of claim 13, further comprising an actuator constructed and arranged to move the gas gauge.

15. The gas gauge of claim 12, further comprising a restrictive element configured to restrict a flow of gas into the reference nozzle and/or measurement nozzle.

16. The gas gauge of claim 12, wherein the gas gauge is provided in a lithographic apparatus comprising:
a projection system constructed and arranged to receive a patterned radiation beam and project the patterned radiation beam onto a substrate; and
a substrate table configured to hold the substrate.

17. An apparatus comprising:
a metrology frame constructed and arranged as a substantially stationary frame of reference;
a measurement platform comprising at least three gas gauges, the measurement platform being movable relative to the metrology frame and a measured surface, each of the gas gauges having a measurement nozzle configured to provide a gas to the measured surface;
a reference frame comprising a reference surface, the reference frame mounted to the measurement platform or the metrology frame;
wherein the measurement platform comprises a plurality of reference nozzles fluidly connected to each other by one or more channels and configured to provide gas to the reference surface, the number of reference nozzles being at least two but less than the number of measurement nozzles, and
wherein the plurality of gas gauges are positioned in an array extending in a direction that is substantially parallel to the measured surface.

18. The apparatus of claim 17, further comprising an actuator configured to move the measurement platform relative to the metrology frame.

19. The apparatus of claim 17, wherein each of the plurality of gas gauges is fluidly connected to the plurality of reference nozzles.

20. The apparatus of claim 17, wherein each of the plurality of gas gauges further comprises a MEMs sensor that is constructed and arranged to sense a difference in backpressure.

* * * * *